(12) United States Patent
Suzuki

(10) Patent No.: US 9,901,962 B2
(45) Date of Patent: Feb. 27, 2018

(54) ULTRASONIC CLEANING APPARATUS

(75) Inventor: Kazunari Suzuki, Tokyo (JP)

(73) Assignee: KAIJO CORPORATION, Tokyo (JP)

( * ) Notice: Subject to any disclaimer, the term of this patent is extended or adjusted under 35 U.S.C. 154(b) by 1235 days.

(21) Appl. No.: 13/991,596

(22) PCT Filed: May 28, 2012

(86) PCT No.: PCT/JP2012/063643
§ 371 (c)(1),
(2), (4) Date: Jun. 4, 2013

(87) PCT Pub. No.: WO2013/008542
PCT Pub. Date: Jan. 17, 2013

(65) Prior Publication Data
US 2013/0312787 A1 Nov. 28, 2013

(30) Foreign Application Priority Data

Jul. 12, 2011 (JP) .................................. 2011-153803

(51) Int. Cl.
*B08B 3/12* (2006.01)
*H01L 21/02* (2006.01)
*H01L 21/67* (2006.01)

(52) U.S. Cl.
CPC .......... *B08B 3/12* (2013.01); *H01L 21/02052* (2013.01); *H01L 21/02057* (2013.01); *H01L 21/67057* (2013.01)

(58) Field of Classification Search
None
See application file for complete search history.

(56) References Cited

U.S. PATENT DOCUMENTS

| 6,543,080 | B1 | 4/2003 | Tomita et al. |
| 6,726,848 | B2 | 4/2004 | Hansen et al. |

(Continued)

FOREIGN PATENT DOCUMENTS

| JP | 10-106998 A | 4/1998 |
| JP | 10-309548 A | 11/1998 |

(Continued)

OTHER PUBLICATIONS

International Search Report (ISR) dated Aug. 7, 2012 (and English translation thereof) issued in parent International Application No. PCT/JP2012/063643.

*Primary Examiner* — Katelyn B Whatley
(74) *Attorney, Agent, or Firm* — Holtz, Holtz & Volek PC

(57) ABSTRACT

There are provided an ultrasonic cleaning apparatus and an ultrasonic cleaning method capable of suppressing occurrence of damage on a substrate to be cleaned and capable of performing cleaning at a high cleaning level for highly precise substrates and the like used in an electronics industry. Occurrence of damage on the substrate to be cleaned is suppressed by holding an object to be cleaned so as to be positioned out of a region where perpendiculars extend from an oscillating surface of an ultrasonic transducer to a liquid surface (an ultrasonic-irradiated region) under and in the vicinity of the liquid surface of a cleaning solution, exciting a capillary wave on a surface of the cleaning solution by an ultrasonic wave, and separating particulate contamination of the object to be cleaned by an acoustic pressure generated by the capillary wave without irradiating the object to be cleaned directly with the ultrasonic wave.

9 Claims, 16 Drawing Sheets

(56) References Cited

U.S. PATENT DOCUMENTS

| | | | |
|---|---|---|---|
| 7,111,632 B2* | 9/2006 | Berman | B08B 3/12 134/155 |
| 2004/0198051 A1 | 10/2004 | Hansen et al. | |
| 2005/0003737 A1* | 1/2005 | Montierth | A61B 8/546 451/5 |
| 2005/0121051 A1* | 6/2005 | Okano | B08B 3/10 134/1.3 |
| 2006/0148267 A1 | 7/2006 | Hansen et al. | |
| 2007/0119544 A1 | 5/2007 | Hansen et al. | |
| 2009/0180086 A1* | 7/2009 | Ryu | B08B 1/007 355/30 |

FOREIGN PATENT DOCUMENTS

| | | | |
|---|---|---|---|
| JP | 11-040645 A | | 2/1999 |
| JP | 2000-173978 A | | 6/2000 |
| JP | 2001-053047 A | | 2/2001 |
| JP | 2003320328 A | * | 11/2003 |
| JP | 2005-512340 A | | 4/2005 |
| WO | WO 00/21692 A1 | | 4/2000 |

* cited by examiner

US 9,901,962 B2

ULTRASONIC CLEANING APPARATUS

BACKGROUND OF THE INVENTION

1. Field of the Invention

The present invention relates to an ultrasonic cleaning apparatus and an ultrasonic cleaning method and, more specifically, to an ultrasonic cleaning apparatus and an ultrasonic cleaning method capable of cleaning at a high cleaning level without causing damage to objects to be cleaned.

2. Description of the Related Art

In an electronics industry, high cleaning levels are required in cleaning of glass substrates or substrates for silicon wafers. Examples of methods of cleaning objects to be cleaned such as the substrates as described above include a dip system in which a plurality of the substrates are immersed in a cleaning solution and a single wafer system in which the cleaning solution is injected onto the substrates and clean the same one by one. In recent years, the single wafer system which allows the cleaning at the high cleaning levels and is advantageous in terms of costs is predominantly employed. The dip system and the single wafer system are both included in a cleaning method in which ultrasonic oscillations are applied into the interior of cleaning solution to remove particulate contamination from the objects to be cleaned by oscillating actions thereof, and are put to practical use as the ultrasonic cleaning.

For example, in the ultrasonic cleaning of the dip system, the ultrasonic oscillations are applied toward the objects to be cleaned such as the substrates immersed in a container filled with the cleaning solution. Minute air bubbles (cavitation air bubbles) generated when the ultrasonic oscillations are propagated in liquid oscillate in accordance with positive and negative cycles of the ultrasonic oscillations, and remove the particulate contamination existing in the periphery thereof. However, when an amplitude of the ultrasonic oscillations increases, the air bubbles are broken in the positive cycle, and an impact wave generated at that time causes damage to the objects to be cleaned. In particular, in low-frequency ultrasonic waves not exceeding 100 kHz, the amplitudes of the ultrasonic oscillations are large, and hence the objects to be cleaned are subject to damage. Therefore, in the cleaning of the glass substrates or the silicon wafers in the electronics industry, high-frequency ultrasonic waves at 400 kHz or higher the amplitudes of the ultrasonic oscillations of which are small are employed.

JP-A-10-309548, JP-A-10-106998, International Publication WO00/21692, and JP-T-2005-512340 disclose a single wafer system ultrasonic cleaning. According to the ultrasonic cleaning disclosed in JP-A-10-309548, a cleaning solution is introduced into a head having an ultrasonic generator built therein, then the cleaning solution is supplied from an exit side of the head toward an object to be cleaned to be dropped into a cleaning solution tank, and the object to be cleaned is moved by being pulled perpendicularly upward from the cleaning solution tank. Surface acoustic waves or plate waves are excited in the object to be cleaned by the supply of the cleaning solution and application of the ultrasonic waves by the head, and the cleaning solution being in contact with the surface of the object to be cleaned is provided with a flowing force, and a current distribution of the cleaning solution presents a high flowing velocity in the vicinity of the surface. In this manner, the particulate contamination adhered to an upper surface of the object to be cleaned is separated by the surface acoustic waves or the plate waves.

According to the ultrasonic cleaning disclosed in JP-A-10-106998, ultrasonic oscillations are applied to a cleaning solution supplied to a container opened on top to push up the cleaning solution from a horizontal surface. In a state in which a lower surface of an object to be cleaned such as a substrate is in contact with the cleaning solution pushed upward from the horizontal surface, the object to be cleaned is moved in the horizontal direction. At the same time, the cleaning solution is supplied from an upper surface of the object to be cleaned. Part of the ultrasonic wave applied from the lower surface of the object to be cleaned penetrates through the object to be cleaned to the upper surface thereof, and acts on a particulate contamination adhered to the upper surface of the object to be cleaned, whereby a cleaning process is performed.

According to the ultrasonic cleaning disclosed in International Publication WO00/21692, a transducer having an irradiation surface area being comparable with an object to be cleaned immersed in a container filled with a cleaning solution is arranged in parallel thereto, and ultrasonic oscillations are applied toward a lower surface of the object to be cleaned. At this time, part of the ultrasonic oscillations penetrates through the object to be cleaned, and acts on a particulate contamination adhered to an upper surface of a substrate to be cleaned, whereby the both surfaces of the substrate to be cleaned are cleaned simultaneously. Accordingly, a period required for cleaning the object to be cleaned is reduced.

JP-T-2005-512340 discloses a processing apparatus illustrated in FIG. 16. As illustrated in FIG. 16, megasonic vibrating units 304 are arranged at both ends of an upper portion of a chamber 300 obliquely with respect to a liquid surface, and a substrate S is moved by substrate supporting notches 302 in the perpendicular direction. A cleaning solution is supplied from a bottom of the chamber 300 to cause the cleaning solution to drop from weirs at the upper portion of the chamber 300. The processing apparatus is configured to perform cleaning on the substrates by irradiating the substrates directly with energy E from the megasonic vibrating unit 304 while moving the substrates S in the perpendicular direction by the substrate supporting the notches 302.

However, in the dip-system ultrasonic cleaning of the related art in which a plurality of the substrates are cleaned simultaneously, the cleaning solution flows along the surfaces of the objects to be cleaned, but layers of several microns or smaller flowing little or never exist along interfaces. Therefore, there is a problem that the contamination adhered to the surfaces of the objects to be cleaned may not be removed sufficiently. Although application of the ultrasonic waves is effective as a device for destabilizing the layer of the cleaning solution in the vicinity of the surfaces of the objects to be cleaned, there is a problem that sufficient cleaning is not achieved with an ultrasonic wave on the order of 1 MHz the amplitude of the ultrasonic oscillations of which is small.

Furthermore, in a case of a semiconductor device progressed in miniaturization, occurrence of damage is reported even with the ultrasonic wave on the order of 1 MHz the amplitude of the ultrasonic oscillations of which is small. In all of the single wafer system cleaning methods of the related art disclosed in JP-A-10-309548, JP-A-10-106998, International Publication WO00/21692, and JP-T-2005-512340, the objects to be cleaned by themselves are oscillated by applying the ultrasonic waves directly to the back sides of the objects to be cleaned having no fine pattern, whereby ultrasonic energy is propagated to minute devices on the surfaces of the substrates. Therefore, the semiconductor device progressed in miniaturization may be subject to occurrence of damage by being influenced by the ultrasonic oscillations even with the ultrasonic wave on the order of 1 MHz the amplitude of the ultrasonic oscillations of which is small.

SUMMARY

It is an object of the invention to provide an ultrasonic cleaning apparatus and an ultrasonic cleaning method in which occurrence of damage on a substrate to be cleaned is suppressed by holding an object to be cleaned so as to be positioned out of a region where perpendiculars extend from an oscillating surface of an ultrasonic transducer to a liquid surface (an ultrasonic-irradiated region) under and in the vicinity of the liquid surface of a cleaning solution, exciting a capillary wave on the surface of the cleaning solution by an ultrasonic wave, and separating particulate contamination of the object to be cleaned by an acoustic pressure generated by the capillary wave without irradiating the object to be cleaned directly with the ultrasonic wave, and capable of cleaning the highly precise substrate and the like used in the electronics industry or the like at high cleaning level.

In order to solve the above-described object, according to a first aspect of the invention, there is provided an ultrasonic cleaning apparatus including: a cleaning tank in which a cleaning solution is stored and an object to be cleaned is immersed therein; an ultrasonic transducer configured to generate an ultrasonic oscillation; a vibrating plate configured to apply the ultrasonic oscillation from the ultrasonic transducer to the cleaning solution; and an ultrasonic generator configured to drive the ultrasonic transducer, wherein the object to be cleaned is held so as to be positioned out of a region formed where perpendiculars extend from an oscillating surface of the ultrasonic transducer to a liquid surface and is cleaned.

Preferably, the object to be cleaned is held at a position where a flat wave of an ultrasonic wave from the ultrasonic transducer does not hit directly.

Preferably, the ultrasonic transducer is driven to apply the ultrasonic wave toward the liquid surface of the cleaning solution in the cleaning tank by the vibrating plate to generate a capillary wave on the liquid surface of the cleaning solution.

Preferably, the object to be cleaned is cleaned by the capillary wave on the liquid surface of the cleaning solution.

Preferably, the cleaning solution is supplied so that the cleaning solution flows in the same direction as a direction of propagation of the capillary wave.

Preferably, a distance from the object to be cleaned to the liquid surface of the cleaning solution is 10 mm (millimeters) or smaller.

Preferably, the object to be cleaned is held so as to be parallel to the liquid surface of the cleaning solution in the cleaning tank and positioned in the vicinity of the liquid surface of the cleaning solution.

Preferably, the ultrasonic transducer and the vibrating plate are provided so as to be parallel to the liquid surface of the cleaning solution.

Preferably, the ultrasonic transducer and the vibrating plate are provided obliquely with respect to the liquid surface of the cleaning solution.

Preferably, the vibrating plate is arranged over an entire bottom surface of the cleaning tank, and the ultrasonic generator configured to drive the ultrasonic transducer includes a generating circuit, an amplitude modulating circuit, and a frequency modulating circuit, and is configured to perform cleaning by exciting the ultrasonic transducer with a signal obtained by modulating a signal having a frequency of 400 KHz or higher from the generating circuit by the amplitude modulating circuit and/or the frequency modulating circuit, and irradiating the interior of the cleaning solution with an ultrasonic wave.

Preferably, one or a plurality of the ultrasonic transducers are arranged so as to surround the object to be cleaned in plan view.

According to a second aspect of the invention, there is provided an ultrasonic cleaning method for cleaning an object to be cleaned by an ultrasonic oscillation including: an ultrasonic oscillation generating device including an ultrasonic transducer configured to emit an ultrasonic oscillation; and a cleaning tank in which the ultrasonic oscillation generating device is mounted, a cleaning solution is stored, and the object to be cleaned is immersed therein, wherein the object to be cleaned is held so as to be positioned out of a region formed where perpendiculars extend from an oscillating surface of the ultrasonic transducer of the ultrasonic oscillation generating device to a liquid surface and is cleaned.

Preferably, the object to be cleaned is held at a position where a flat wave of an ultrasonic wave from the ultrasonic transducer of the ultrasonic oscillation generating device does not hit directly.

Preferably, the ultrasonic transducer of the ultrasonic oscillation generating device is driven to apply an ultrasonic wave toward the liquid surface of the cleaning solution in the cleaning tank to generate a capillary wave on the liquid surface of the cleaning solution.

Preferably, the object to be cleaned is cleaned by the capillary wave on the liquid surface of the cleaning solution.

Preferably, the cleaning solution is supplied so that the cleaning solution flows in the same direction as a direction of propagation of the capillary wave.

Preferably, one or a plurality of the ultrasonic transducers are arranged so as to surround the object to be cleaned in plan view.

According to the invention, the object to be cleaned is held out so as to be positioned of the ultrasonic-irradiated region in the cleaning tank of the ultrasonic transducer, and cleaning is performed without irradiating the object to be cleaned directly with the ultrasonic wave, so that damage on the substrate to be cleaned may be suppressed.

The ultrasonic wave is applied to the surface of the cleaning solution in the proximity to the surface of the object to be cleaned to excite the capillary wave, and the particulate contamination is separated from the object to be cleaned by the acoustic pressure caused by the capillary wave, so that the cleaning at a high cleaning level may be performed with respect to the highly precise substrate and the like.

The cleaning solution is supplied so as to flow in the same direction as the direction of propagation of the capillary wave, so that re-adhesion of the particulate contamination separated from the objects to be cleaned may be prevented.

The object to be cleaned are held so as to extend in parallel to the liquid surface of the cleaning solution in the cleaning tank and be positioned in the vicinity of the liquid level of the cleaning solution, and the distance from the object to be cleaned to the liquid surface of the cleaning solution is set to be 10 mm (millimeter) or smaller, so that the depth of the cleaning tank may be small, and hence the cleaning with small amount of the cleaning solution is enabled.

Since the capillary wave propagates over the entire area of the object to be cleaned along the surface of the object to be cleaned according to the invention, there is no moving device configured to move the object to be cleaned during cleaning, so that the ultrasonic cleaning apparatus may be simplified.

DESCRIPTION OF EMBODIMENTS

Figure 1A:
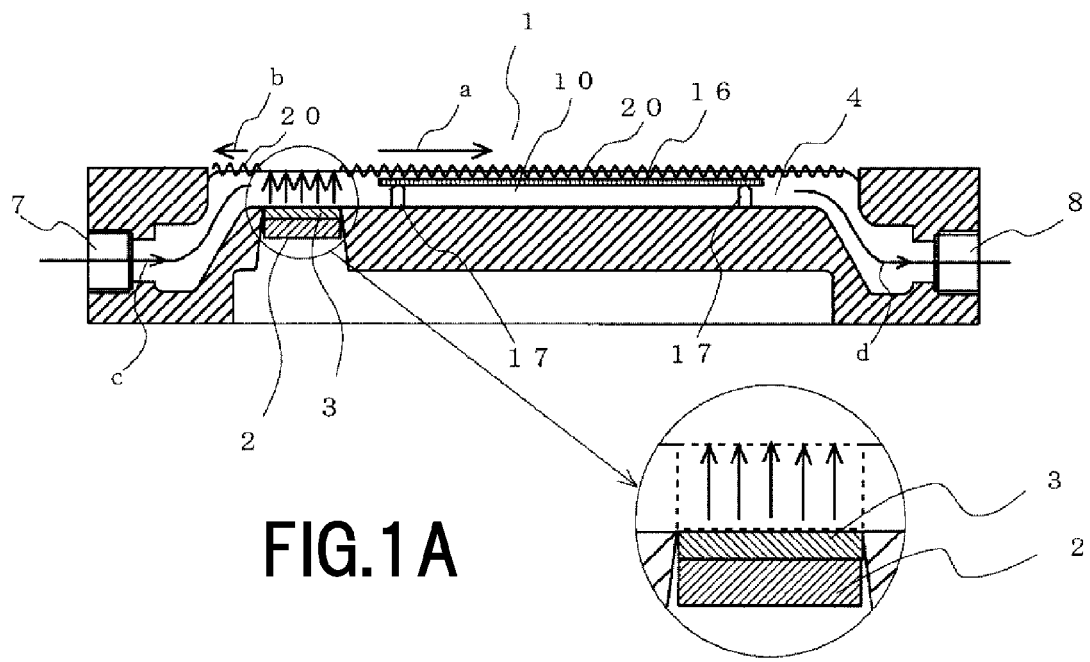
FIG. 1A is a partly enlarged cross-sectional front view illustrating a configuration of an ultrasonic cleaning apparatus according to a first embodiment of the invention.

Referring now to the drawings, embodiments for implementing an ultrasonic cleaning apparatus and an ultrasonic cleaning method according to the invention will be described.

First Embodiment

Figure 1B:
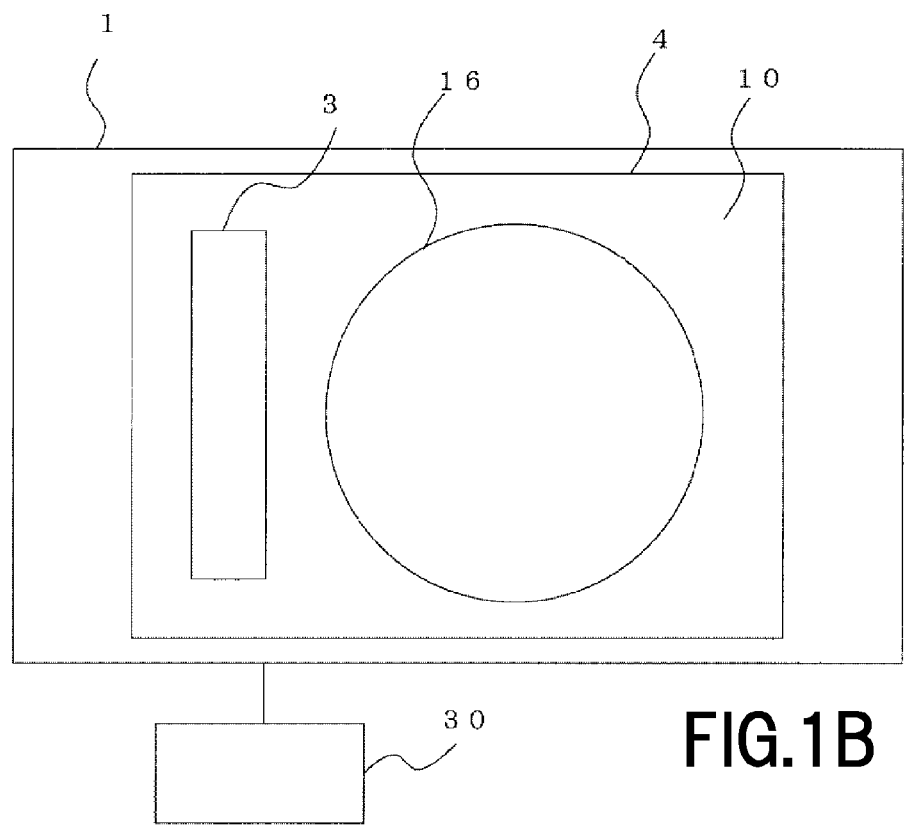
FIG. 1B is a plan view illustrating the configuration of the ultrasonic cleaning apparatus in FIG. 1A.

FIG. 1A is a partly enlarged cross-sectional front view illustrating a configuration of an ultrasonic cleaning apparatus according to a first embodiment of the invention;

FIG. 1B is a plan view illustrating the configuration of the ultrasonic cleaning apparatus. The ultrasonic cleaning apparatus illustrated in FIGS. 1A and 1B are of a single wafer system that processes silicon wafers one by one. As illustrated in FIGS. 1A and 1B, an ultrasonic cleaning apparatus 1 includes a cleaning tank 4 configured to store a cleaning solution 10, a cleaning solution supply port 7 (illustrated in FIG. 1A) provided on a side surface of the cleaning tank 4, a cleaning liquid draining port 8 (illustrated in FIG. 1A) provided on a side surface facing the side surface of the cleaning tank 4 having the cleaning solution supply port 7, a vibrating plate 3 provided on a bottom of the cleaning tank 4 on the side of the cleaning solution supply port 7, an ultrasonic transducer 2 provided on a lower surface of the vibrating plate 3, and a holding portion 17 (illustrated in FIG. 1A) configured to hold an object to be cleaned 16. The ultrasonic cleaning apparatus 1 is also provided with an ultrasonic generator 40 (illustrated in FIG. 1B) configured to supply high-frequency power to the ultrasonic transducer 2.

When washing a semiconductor wafer such as the silicon wafer as the object to be cleaned 16, the semiconductor wafer is arranged so that a back surface of the semiconductor wafer extends in parallel to a bottom surface of the cleaning tank 4, and is placed on the holding portion 17 so that a front surface of the semiconductor wafer is positioned on the side of a liquid surface of the cleaning solution 10. As illustrated in FIG. 1B, the semiconductor wafer is held so as not to be positioned above the vibrating plate 3 in top view in a state in which the semiconductor wafer as the object to be cleaned 16 is placed on the holding portion 17. In other words, as illustrated in FIG. 1A, the semiconductor wafer is held in a state in which the vibrating plate 3 and a distal end of the semiconductor wafer is apart from each other in the horizontal direction in side view. Therefore, the horizontal and vertical size of the interior of the cleaning tank 4 is set to have a sufficient length for immersing the semiconductor wafer as the object to be cleaned 16 and additionally including the size of the vibrating plate 3 as illustrated in FIG. 1B. A depth of the cleaning tank 4 is set to be 20 mm or longer, for example.

The vibrating plate 3 provided on the bottom of the cleaning tank 4 is formed into a rectangular plate shape having a vertical length, which is substantially the same as the size (diameter) of the semiconductor wafer for example, and a horizontal length of 40 mm. A front surface (an oscillating surface) of the vibrating plate 3 is in contact with the cleaning solution 10 of the cleaning tank 4. The ultrasonic transducer 2 is attached to a back surface of the vibrating plate 3 by adhesion. The sizes of the back surface of the vibrating plate 3 and an oscillating surface of the ultrasonic transducer 2 are substantially the same, and the vibrating plate 3 as an ultrasonic wave transmitting member and the ultrasonic transducer 2 are formed integrally. The size of the cleaning tank, the size of the vibrating plate, and the like are determined on the basis of the size of the objects to be cleaned.

The holding portion 17 illustrated in FIG. 1A is provided on the bottom of the cleaning tank 4, is configured to hold the semiconductor wafer as the object to be cleaned 16 in the interior of the cleaning solution 10, and holds the semiconductor wafer by an opening-and-closing mechanism or the like. The cleaning solution supply port 7 provided on the side surface of the cleaning tank 4 illustrated in FIG. 1A is configured to supply a new cleaning solution 10 into the cleaning tank 4 as indicated by a solid arrow c, and the cleaning solution 10 is supplied to the cleaning solution supply port 7 from a cleaning solution tank (not illustrated) or the like provided on the outside. The cleaning liquid draining port 8 is configured to collect the cleaning solution 10 supplied from the cleaning solution supply port 7, and the cleaning solution 10 indicated by a solid line of an arrow d is collected from the cleaning liquid draining port 8 to a storage tank (not illustrated) or the like provided on the outside.

Figure 2:
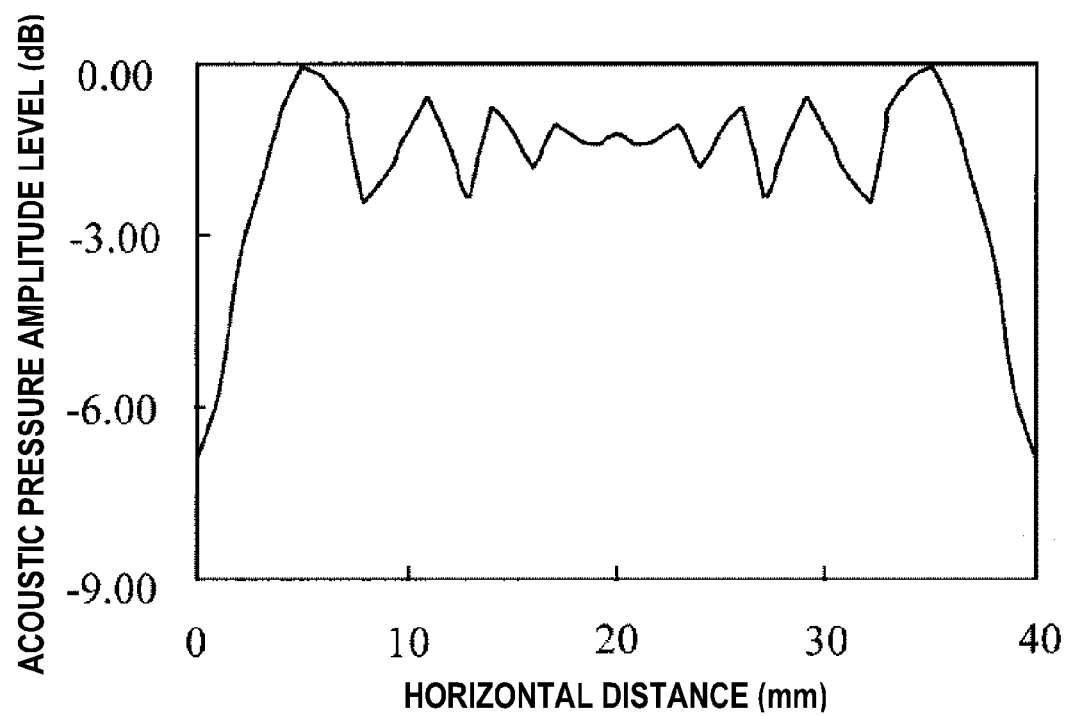
FIG. 2 illustrates a distribution of an acoustic pressure amplitude level at 20 mm away from an oscillating surface of a vibrating plate in the direction of a liquid surface obtained by numerical value calculation.

Subsequently, an irradiated region to be irradiated with the ultrasonic wave emitted from the ultrasonic transducer 2 via the vibrating plate 3 in the ultrasonic cleaning apparatus 1 configured as described above will be described with reference to FIG. 2. FIG. 2 illustrates a distribution of an acoustic pressure amplitude level at 20 mm away from the oscillating surface of the vibrating plate in the direction of the liquid surface obtained as a result of numerical value calculation. The lateral axis in FIG. 2 indicates a distance from one end to the other end of the vibrating plate 3 in the width direction. In the numerical value calculation of the acoustic pressure amplitude level, the width of the vibrating plate 3 is assumed to be 40 mm, and an ultrasonic frequency to be irradiated from the ultrasonic transducer 2 is assumed to be 740 kHz. As illustrated in FIG. 2, the acoustic pressure amplitude level at the ultrasonic frequency of 740 kHz reaches a peak at a lateral length of 15 mm from a center of the vibrating plate 3, and is lowered gradually as it approaches end surfaces of the vibrating plate 3. Accordingly, the ultrasonic wave to be irradiated from the vibrating plate 3 does not diffuse in the interior of the liquid and a region irradiated with the ultrasonic wave is a region where perpendiculars extend from the oscillating surface of the vibrating plate 3 formed integrally with the oscillating surface of the ultrasonic transducer 2 to the liquid surface.

In this manner, the ultrasonic oscillations emitted by the ultrasonic transducer 2 are directed in the perpendicular direction (indicated by arrows from the vibrating plate in FIG. 1A) with respect to the liquid surface of the cleaning solution 10 via the vibrating plate 3 on the bottom of the cleaning tank 4. Therefore, in the ultrasonic cleaning apparatus 1 of the embodiment illustrated in FIG. 1, the irradiated region irradiated with the ultrasonic wave (an ultrasonic-irradiated region) by the ultrasonic transducer 2 falls within a range of a rectangular parallelepiped formed by the surface area of the ultrasonic transducer 2 on the bottom of the cleaning tank 4 and the distance from the vibrating plate 3 to a surface of the cleaning solution 10. In other words, in an enlarged view illustrated in FIG. 1A, the ultrasonic-irradiated region corresponds to a region surrounded by dot lines extending from an end of the oscillating surface of the ultrasonic transducer 2 to the liquid surface. The irradiated region irradiated with the ultrasonic wave by the ultrasonic transducer 2 is determined by the size and the shape of the oscillating surface of the ultrasonic transducer 2 and a mounting angle of the ultrasonic transducer 2 (an angle formed by the oscillating surface of the ultrasonic transducer 2 with respect to the liquid surface).

A flat ultrasonic wave irradiated from the vibrating plate 3 illustrated in FIG. 1A reflects on the surface of the cleaning solution 10, and forms a standing wave acoustic field between the vibrating plate 3 and the surface of the cleaning solution 10. Since the standing wave acoustic field formed between the vibrating plate 3 and the surface of the cleaning solution 10 develops by cavitation bubbles being caught at positions of antinodes of an acoustic pressure, the cavitation bubbles tend to be broken and cause an impact wave. Therefore, when the semiconductor wafer as the objects to be cleaned is positioned in the standing wave acoustic field, a fine pattern on the semiconductor wafer is subject to damage upon reception of the impact wave generated by the breakage of the cavitation bubbles. Furthermore, the semiconductor wafer oscillates upon direct reception of the ultrasonic oscillations, and hence a plate wave is generated in the semiconductor wafer, so that the fine pattern on the semiconductor wafer is subject to damage. In this manner, since the flat ultrasonic wave forms the standing wave acoustic field and causes the breakage of the cavitation bubbles associated with the impact wave, the objects to be cleaned are positioned out of the standing wave acoustic field to avoid the influence of the standing wave acoustic field.

On the other hand, the flat ultrasonic wave irradiated from the vibrating plate 3 causes the cleaning solution 10 to oscillate up and down with the surface of the cleaning solution 10 being a free end of the oscillation and hence generates a capillary wave 20 (indicated by wavy line on the liquid surface in FIG. 1A). The capillary wave 20 propagates along the liquid surface of the cleaning solution 10 (indicated by arrows a and b in FIGS. 1A and 1B), and a traveling wave acoustic field is formed thereby. The capillary wave means a wave propagating along the liquid surface with a surface tension of the liquid as a restoring force. Since the capillary wave does not include a reflective wave, the standing wave acoustic field is not formed.

The invention is configured to apply the ultrasonic wave to the surface of the cleaning solution 10 to excite the capillary wave 20 while holding the object to be cleaned 16 in liquid in the vicinity of the liquid surface of the cleaning solution 10 at a position not irradiated directly with the ultrasonic wave so that the object to be cleaned 16 is not positioned within the standing wave acoustic field, and separate particulate contamination from the object to be cleaned 16 by an acoustic pressure generated by the capillary wave 20. The capillary wave forms the travelling wave acoustic field and generates the cavitation air bubbles effective for removing particulates. Therefore, unlike the related art, the object to be cleaned 16 is not positioned in the standing wave acoustic field formed between the vibrating plate 3 and the surface of the cleaning solution 10 by the flat ultrasonic wave irradiated from the vibrating plate 3, and hence such a problem that the fine pattern formed on the semiconductor wafer as the object to be cleaned 16 is subject to damage is avoided.

Figure 3:
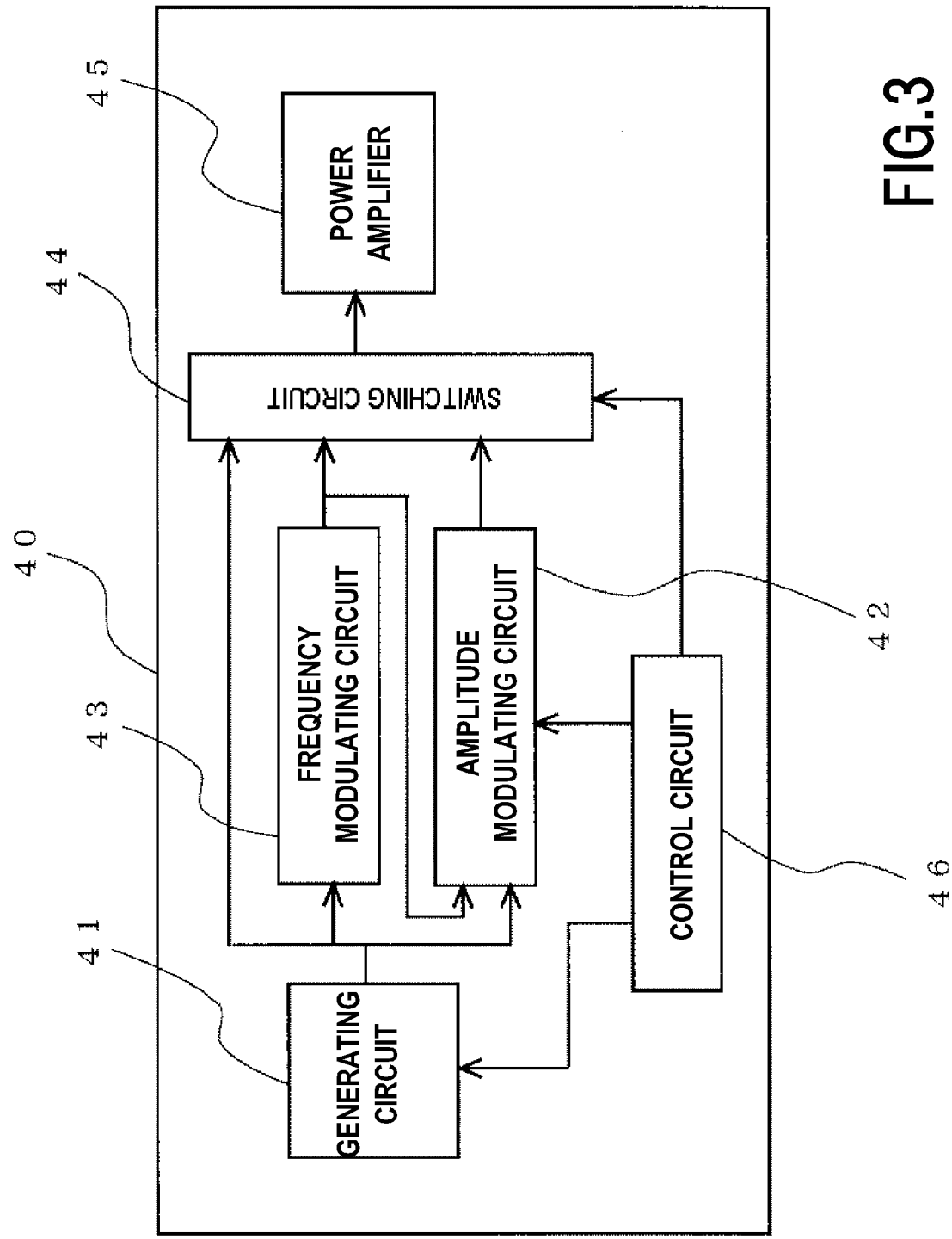
FIG. 3 is a block diagram illustrating a configuration of an ultrasonic generator.

Subsequently, the ultrasonic generator configured to drive an ultrasonic transducer positioned on a bottom of the ultrasonic cleaning apparatus will be described with reference to FIGS. 3 to 6. The ultrasonic transducer generates ultrasonic oscillations upon application of high-frequency power by the ultrasonic generator. FIG. 3 is a block diagram illustrating a configuration of the ultrasonic generator. As illustrated in FIG. 3, in addition to a generating circuit 41 configured to oscillate signals having a frequency of 400 kHz or higher, the ultrasonic generator 40 also includes an amplitude modulating circuit 42 and a frequency modulating circuit 43 configured to modulate the high-frequency signals from the generating circuit 41 integrated therein. In addition, the ultrasonic generator 40 includes a switching circuit 44 configured to select either one of the high-frequency signals composed of a single frequency of 400 kHz or higher and the modulated high-frequency signal and output the selected signal, and a power amplifier 45 configured to amplify the signal from the switching circuit 44. The high-frequency signal is amplified in power by the power amplifier 45, and is applied to the ultrasonic transducer 2 as a drive signal. The ultrasonic generator 40 also includes a control circuit 46 configured to control the generating circuit 41 to start and stop the oscillation, switch the input signal of the amplitude modulating circuit 42, and control the switching circuit 44. The generating circuit 41 is capable of oscillating the signals having the frequencies of 400 kHz or higher, and is configured to oscillate signals having predetermined frequencies by setting.

The ultrasonic generator 40 having the configuration as described above is configured to be capable of selecting either one of an amplitude-modulated high-frequency signal, a frequency-modulated high-frequency signal, and an amplitude-and-frequency-modulated high-frequency signal in addition to the high-frequency signals composed of a single frequency of 400 kHz or higher. The ultrasonic generator 40 is configured to apply either the high frequency signal having a single frequency or the modulated high-frequency signal to the ultrasonic transducer 2 of the ultrasonic cleaning apparatus 1 illustrated in FIG. 1 after having amplified in power. In addition, one of the amplitude-modulated high-frequency signal, the frequency-modulated high-frequency signal, and the amplitude-and-frequency-modulated high-frequency signal selected by the ultrasonic generator 40 is used for an ultrasonic cleaning machine (an ultrasonic cleaning apparatus 30 illustrated in FIG. 8), described later, to excite the plate wave in a vibrating plate 31 (illustrated in FIG. 8) of the ultrasonic cleaning apparatus 30 by the modulated high-frequency signal from the ultrasonic generator 40.

Figure 4A:
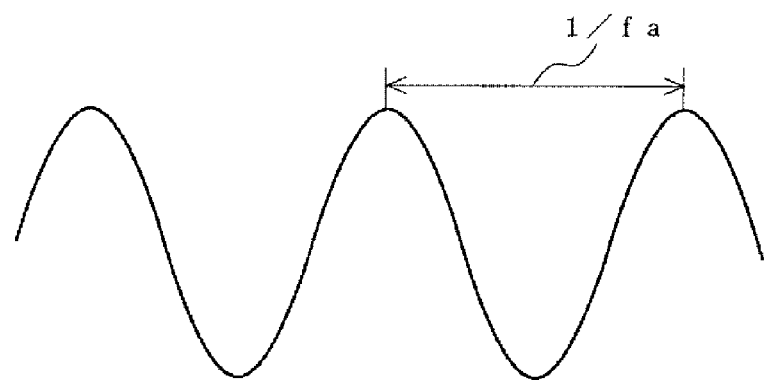
FIG. 4A illustrates a waveform of an amplitude modulation signal.
Figure 4B:
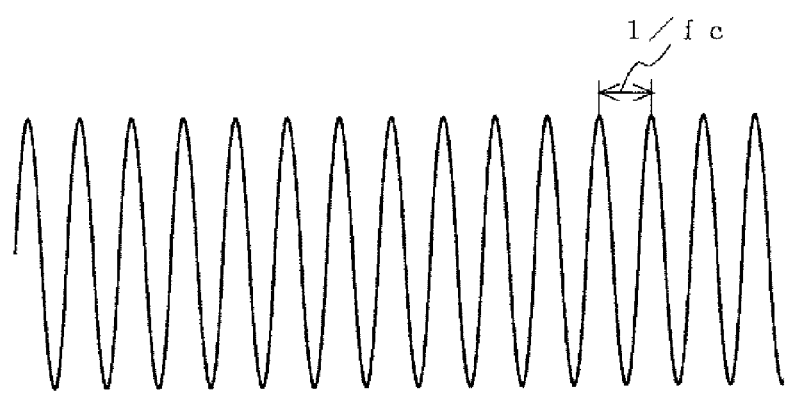
FIG. 4B illustrates a waveform of a signal output from a generating circuit.
Figure 4C:
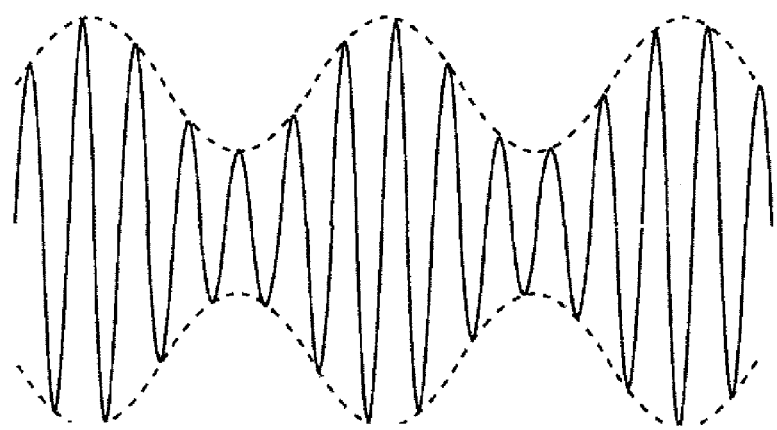
FIG. 4C illustrates a waveform of a high-frequency signal after having modulated the amplitude of a signal output from the generating circuit by the amplitude modulation signal.

First of all, the amplitude modulation of the high-frequency signal will be described with reference to FIG. 4. FIG. 4A illustrates a waveform of an amplitude modulation signal, FIG. 4B illustrates a waveform of a signal output from the generating circuit, and FIG. 4C illustrates a waveform of the high-frequency signal after having modulated the amplitude of the signal output from the generating circuit by the amplitude modulation signal. The amplitude modulation is an operation to change the intensity (amplitude) of the high-frequency signal in accordance with the amplitude of the amplitude modulation signal. In the ultrasonic generator 40 illustrated in FIG. 3, the control circuit 46 sets the signal output from the generating circuit 41 to be input to the amplitude modulating circuit 42, and controls the switching circuit 44 to output the high-frequency signal from the amplitude modulating circuit 42. The ultrasonic generator 40 amplifies the power of the amplitude-modulated high-frequency signal by the power amplifier 45 and excites the ultrasonic transducer 2.

The cycle of the amplitude modulation signal is 1/fa (illustrated in FIG. 4A), where fa is a frequency of the amplitude modulation signal illustrated in FIG. 4A, and the cycle of the signal is 1/fc (illustrated in FIG. 4B), where fc is the frequency of the signal output from the generating circuit 41 illustrated in FIG. 4B. The amplitude-modulated high-frequency signal illustrated in FIG. 4C is composed of two frequency components. In other words, the frequency of the high-frequency signal that drives the ultrasonic transducer includes frequency components of the frequency fc of the signal output from the generating circuit 41 and the frequency fa of the amplitude modulation signal.

Figure 5A:
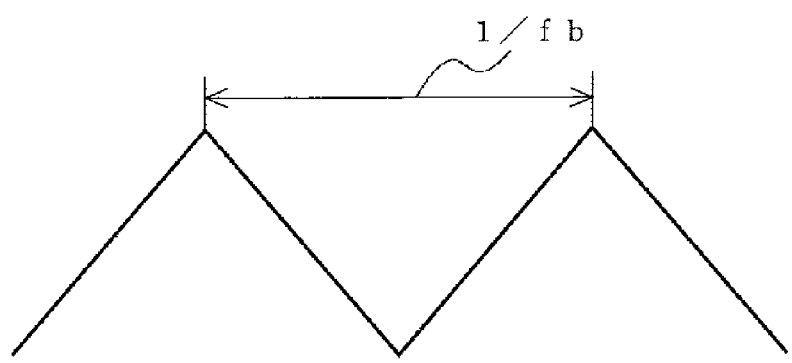
FIG. 5A illustrates a waveform of a frequency modulation signal.
Figure 5B:
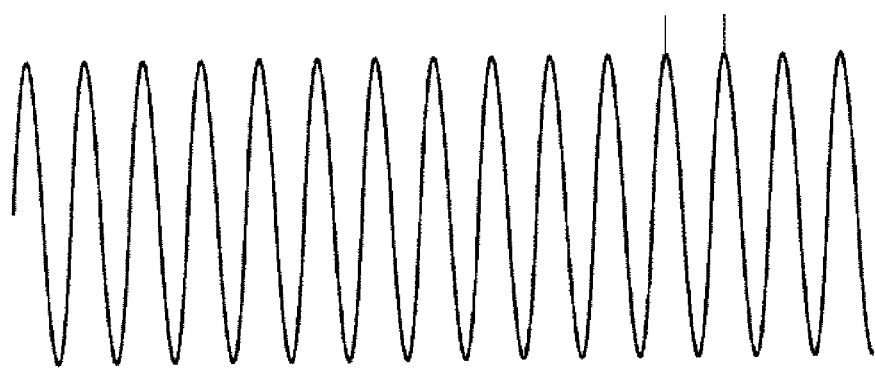
FIG. 5B illustrates a waveform of a signal output from the generating circuit.
Figure 5C:
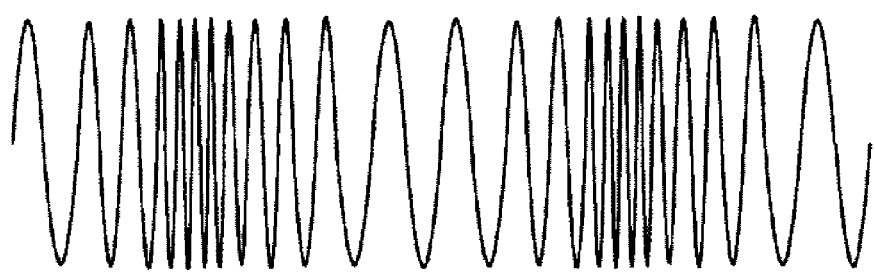
FIG. 5C illustrates a waveform of a high-frequency signal obtained by modulating a frequency of the signal output from the generating circuit by the frequency modulation signal.

Subsequently, the frequency modulation of the high-frequency signal will be described with reference to FIGS. 5A to 5C. FIG. 5A illustrates a waveform of a frequency modulation signal, FIG. 5B illustrates a waveform of a signal output from the generating circuit, and FIG. 5C illustrates a waveform of the high-frequency signal after having modulated the frequency of the signal output from the generating circuit by the frequency modulation signal. The cycle of the frequency modulation signal illustrated in FIG. 5A is 1/fb, where fb is the frequency of the frequency modulation signal, and presents a triangle wave in which the output level is increased with time and then is reduced within the cycle. The frequency modulating circuit 43 is configured to control and output the frequency of the signal output from the generating circuit in accordance with the level of the frequency modulation signal. The frequency-modulated high-frequency signal modulated by the frequency modulation signal illustrated in FIG. 5C has a frequency of fc+fd when the level of the frequency modulation signal is the highest, and has a frequency of fc−fd when the level of the frequency modulation signal is the lowest, and has a frequency of fc when the level of the frequency modulation signal has an intermediate value, where fc is the frequency of the signal output from the generating circuit 41 and ±fd is a frequency modulation width of variations of the signal caused by the frequency modulation.

Figure 6A:
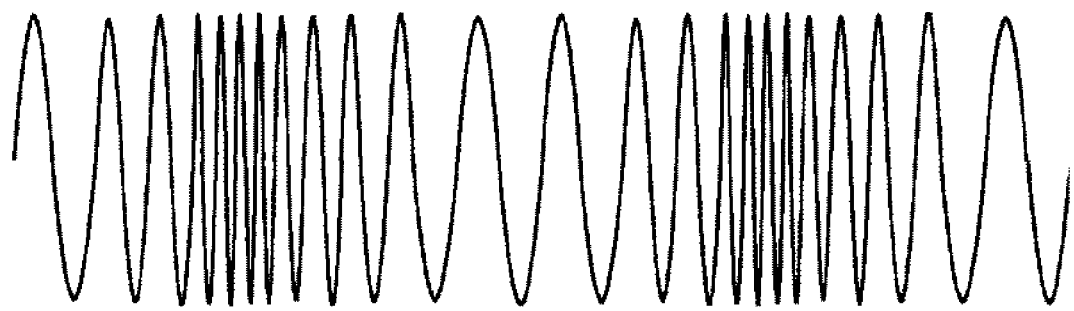
FIG. 6A illustrates a waveform of the high-frequency signal obtained by modulating the frequency of the signal output from the generating circuit by the frequency modulation signal.
Figure 6B:
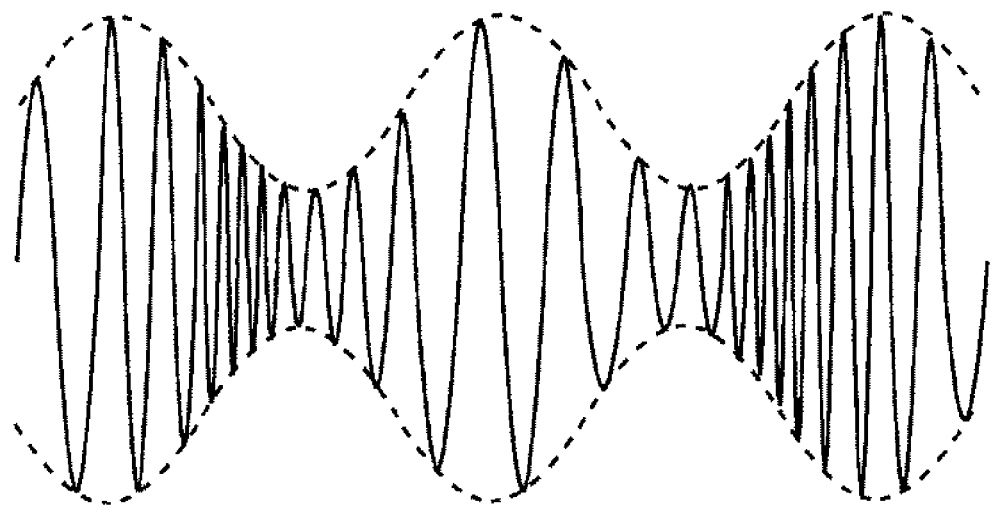
FIG. 6B illustrates a waveform of the high-frequency signal obtained by modulating the amplitude of the frequency-modulated high frequency signal illustrated in FIG. 6A.

Subsequently, the modulation composed of both of the frequency modulation and the amplitude modulation will be described with reference to FIGS. 6A and 6B. FIG. 6A illustrates a waveform of the high-frequency signal obtained by modulating the frequency of the signal output from the generating circuit by the frequency modulation signal, and FIG. 6B illustrates a waveform of a high-frequency signal obtained by modulating the amplitude of the frequency-modulated high frequency signal illustrated in FIG. 6A. In the ultrasonic generator 40 illustrated in FIG. 3, the control circuit 46 switches the input signal into the amplitude modulating circuit 42 to the output signal from the frequency modulating circuit 43, and controls the switching circuit 44 to output the high-frequency signal from the amplitude modulating circuit 42. The ultrasonic generator 40 amplifies the power of the frequency-modulated and amplitude-modulated and high-frequency signal by the power amplifier 45 and excites the ultrasonic transducer 2.

As illustrated in FIG. 6A, the signal output from the generating circuit is the frequency-modulated high-frequency signal modulated by the frequency modulating circuit 43. The high-frequency signal output from the frequency modulating circuit 43 is the same as that illustrated in FIG. 5C. The frequency-modulated high-frequency signal is modulated in amplitude by the amplitude modulating circuit 42. As illustrated in FIG. 6B, the high-frequency signal output from the switching circuit 44 is the frequency-modulated high-frequency signal further modulated in amplitude. Accordingly, the frequency-modulated high-frequency signal is further modulated in amplitude, so that the ultrasonic transducer 2 can be excited by amplifying the power of the amplitude-modulated high-frequency signal.

Accordingly, the ultrasonic generator 40 is configured to be capable of outputting one of the amplitude-modulated high-frequency signal, the frequency-modulated high-frequency signal, and the amplitude-and-frequency-modulated high-frequency signal in addition to the high-frequency signal composed of the single frequency of 400 kHz or higher.

Subsequently, cleaning of the object to be cleaned by the ultrasonic cleaning apparatus 1 illustrated in FIG. 1 will be described. As illustrated in FIG. 1, the object to be cleaned 16 is immersed in the cleaning tank 4 filled with the cleaning solution 10, and the object to be cleaned 16 is held in parallel to and in the vicinity of the surface of the cleaning solution 10 by the holding portion 17. The power-amplified high-frequency signal is applied from the ultrasonic generator 40 to the ultrasonic transducer 2 adhered to the vibrating plate 3 positioned on the bottom surface of the cleaning tank 4. The frequency of the high-frequency signal of the ultrasonic generator 40 is 400 kHz or higher and, for example, the high-frequency signal having a single frequency of 740 kHz is used. The ultrasonic transducer 2 being excited generates the flat ultrasonic wave in the cleaning solution 10 in the cleaning tank 4 from the ultrasonic transducer 2. As illustrated in FIGS. 1A and 2B, a new cleaning solution 10 is supplied from the cleaning solution supply port 7 into the cleaning tank 4, flows along the surface of the object to be cleaned 16, and then is drained from the cleaning liquid draining port 8. The flat ultrasonic wave is applied toward the surface of the cleaning solution 10, and the object to be cleaned 16 is not arranged in a propagation route of the flat ultrasonic wave. Accordingly, the flat ultrasonic wave reaches directly the surface of the cleaning solution 10 without being interrupted by the object to be cleaned 16, the capillary wave is excited on the surface of the cleaning solution 10 and is propagated as the traveling waves in two left and right directions (indicated by the arrows a and b) from the liquid surface right above the vibrating plate 3 as illustrated in FIG. 1. In addition, the particulate contamination is flowed by the new cleaning solution 10 by aligning the direction of propagation of the capillary wave (the arrow a illustrated in FIG. 1) with the direction of supply of the cleaning solution 10 from the cleaning solution supply port 7, whereby re-adherence of the particulate contamination onto the surface of the object to be cleaned 16 is prevented. By bringing the surface of the cleaning solution 10 and the ultrasonic transducer 2 as close as possible, the amount of the cleaning solution 10 in the cleaning tank may be reduced. It is also possible to use one of the amplitude-modulated high-frequency signal, the frequency-modulated high-frequency signal, and the amplitude-and-frequency-modulated high-frequency signal instead of the high-frequency signal composed of a single frequency from the ultrasonic generator 40. A difference in intensity of the acoustic pressure is generated in the flat ultrasonic wave by the modulated high-frequency signal, and hence the difference in intensity of the acoustic pressure is generated in the capillary wave excited thereby, so that the cleaning effect may be enhanced.

In this manner, the ultrasonic cleaning apparatus of the invention is configured to hold the object to be cleaned so as to be positioned out of the ultrasonic-irradiated region in the cleaning tank of the ultrasonic transducer, excite the capillary wave by applying an ultrasonic wave to the liquid surface of the cleaning solution without irradiating the object to be cleaned directly with the ultrasonic wave, and separate the particulate contamination from the object to be cleaned by the acoustic pressure caused by the capillary wave. Consequently, damage on substrates to be cleaned may be suppressed and cleaning at a high cleaning level is achieved.

Subsequently, another ultrasonic cleaning apparatus according to the first embodiment of the invention will be described with reference to FIG. 7.

Figure 7:
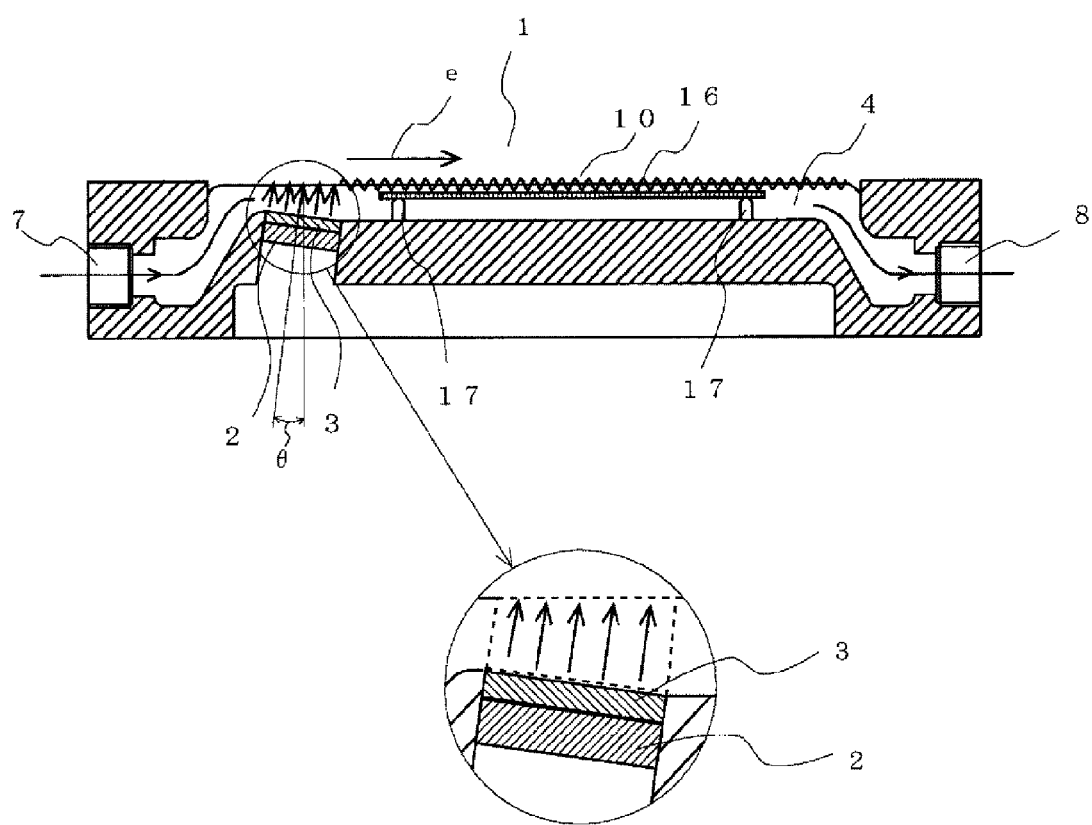
FIG. 7 is a partly enlarged cross-sectional view illustrating a configuration of another ultrasonic cleaning apparatus according to the first embodiment of the invention.

FIG. 7 is a partly enlarged cross-sectional view illustrating a configuration of the other ultrasonic cleaning apparatus according to the first embodiment of the invention. The same components as those in FIG. 1 are denoted by the same reference numerals, and detailed descriptions relating to the configuration thereof are omitted. The ultrasonic cleaning apparatus 1 illustrated in FIG. 1 includes the vibrating plate 3 and the ultrasonic transducer 2 arranged in parallel to the liquid surface of the cleaning solution 10. In contrast, the ultrasonic cleaning apparatus 1 illustrated in FIG. 7 includes the vibrating plate 3 and the ultrasonic transducer 2 arranged obliquely with respect to the liquid surface.

Since the vibrating plate 3 and the ultrasonic transducer 2 are arranged obliquely with respect to the liquid surface as illustrated in FIG. 7, the ultrasonic wave from the vibrating plate 3, with which that the liquid surface is irradiated, is propagated at a right angle from the surface of the vibrating plate 3. Therefore, the irradiated region of the ultrasonic wave (an ultrasonic-irradiated region) by the ultrasonic transducer 2 falls within the region extending from the oscillating surface of the vibrating plate 3 to the liquid surface at a right angle. In other words, in an enlarged view illustrated in FIG. 7, the ultrasonic-irradiated region corresponds to the region surrounded by dot lines extending from the end of the oscillating surface of the ultrasonic transducer 2 to the liquid surface. According to the ultrasonic cleaning apparatus 1 illustrated in FIG. 7, the object to be cleaned 16 is not positioned in the ultrasonic-irradiated region in the same manner as the ultrasonic cleaning apparatus 1 illustrated in FIGS. 1A and 1B. Accordingly, since the object to be cleaned 16 is not exposed directly to the ultrasonic oscillation, generation of the plate wave in the object to be cleaned 16 by itself is avoided, and hence the fine pattern on the semiconductor wafer as the object to be cleaned 16 is not subject to damage. As illustrated in FIG. 7, since the vibrating plate 3 and the ultrasonic transducer 2 are arranged obliquely with respect to the liquid surface, the direction of propagation of the capillary wave is one way indicated by an arrow e, and hence the capillary wave is not propagated over the entire circumference. Therefore, generation of the capillary wave is efficiently achieved. In this manner, by setting an incident angle θ of the ultrasonic wave illustrated in FIG. 7 to an angle which prevents the flat ultrasonic wave from the ultrasonic transducer from directly hitting against the object to be cleaned, the direction of propagation of the capillary wave is limited to one direction, so that an efficient utilization of the ultrasonic energy is achieved.

Figure 8:
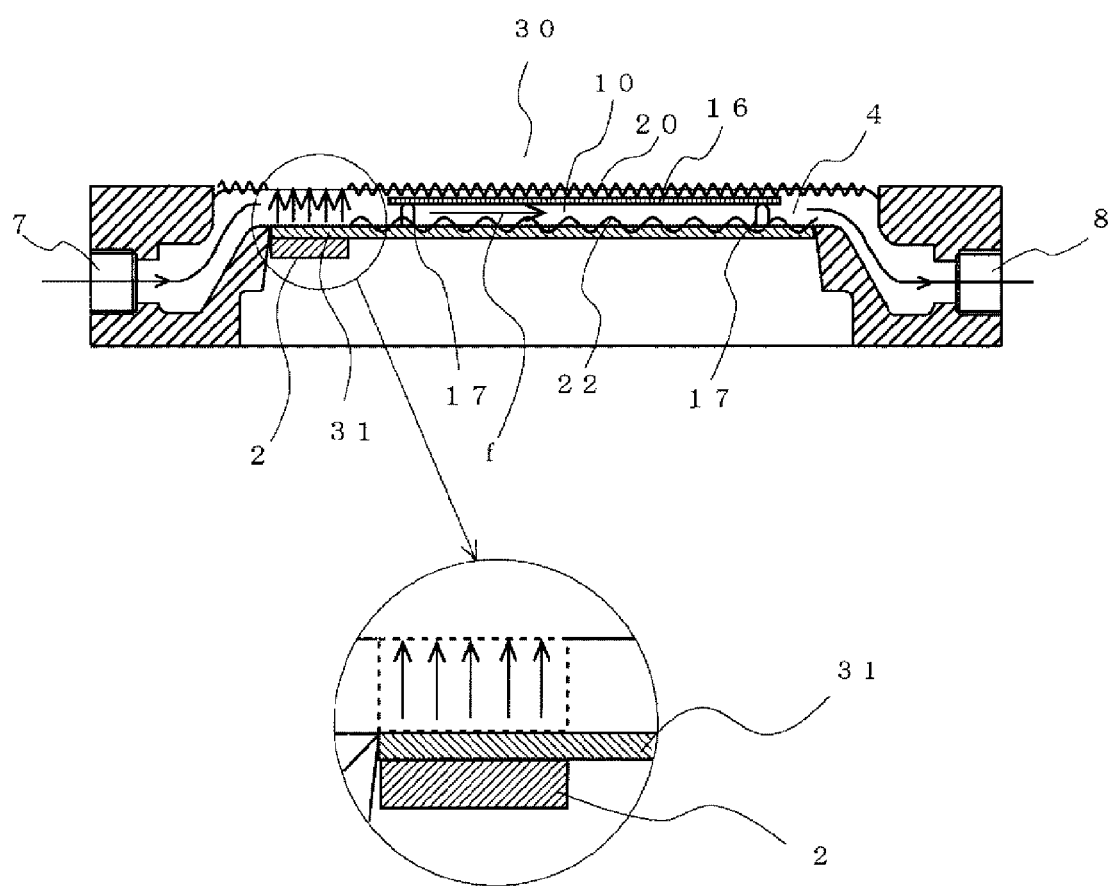
FIG. 8 is a partly enlarged cross-sectional view illustrating a configuration of an ultrasonic cleaning apparatus in which a vibrating plate is arranged over an entire surface of a bottom.

Subsequently, the ultrasonic cleaning apparatus in which the vibrating plate on the bottom of the ultrasonic cleaning apparatus is arranged over the entire surface of the bottom to form a flow of the cleaning solution on the back surface of the object to be cleaned will be described with reference to FIG. 8. FIG. 8 is a partly enlarged cross-sectional view illustrating a configuration of the ultrasonic cleaning apparatus in which the vibrating plate is arranged over the entire surface of the bottom. The same components as those in FIG. 1 are denoted by the same reference numerals, and detailed description relating to the configuration thereof is omitted. As illustrated in FIG. 8, the ultrasonic cleaning apparatus 30 includes the cleaning tank 4 configured to store the cleaning solution 10, the cleaning solution supply port 7 provided on the side surface of the cleaning tank 4, the cleaning liquid draining port 8 provided on the side surface facing the side surface of the cleaning tank 4 having the cleaning solution supply port 7, the vibrating plate 31 provided on the bottom of the cleaning tank 4 on the side of the cleaning solution supply port 7, the ultrasonic transducer 2 provided on a lower surface of the vibrating plate 31, and the holding portion 17 configured to hold the object to be cleaned 16. The vibrating plate 31 is arranged over the entire surface of the bottom, and the ultrasonic transducer 2 positioned on the back surface of the vibrating plate 31 is provided on the bottom of the cleaning tank 4 on the side of the cleaning solution supply port 7. Accordingly, the ultrasonic cleaning apparatus in this example is different from the ultrasonic cleaning apparatus 1 illustrated in FIG. 1 in size of the vibrating plate 3 provided on the bottom of the cleaning tank 4. The ultrasonic transducer 2 illustrated in FIG. 8 has the same shape and size as the ultrasonic transducer 2 illustrated in FIG. 1, and the mounting position in the cleaning tank 4 is also the same. The irradiated region of the ultrasonic wave (the ultrasonic-irradiated region) by the ultrasonic transducer 2 falls within the region where perpendiculars extend from the vibrating plate 31 of the ultrasonic transducer 2 to the liquid surface. In other words, in the enlarged view illustrated in FIG. 8, the ultrasonic-irradiated region corresponds to the region surrounded by dot lines extending from the end of the oscillating surface of the ultrasonic transducer 2 to the liquid surface.

In the ultrasonic cleaning apparatus 30 illustrated in FIG. 8, the ultrasonic transducer 2 provided on the vibrating plate 31 arranged over the entire surface of the bottom of the cleaning tank 4 is driven by the high-frequency signal modulated by the ultrasonic generator 40 illustrated in FIG. 3. In other words, the ultrasonic generator 40 is configured to output one of the amplitude-modulated high-frequency signal, the frequency-modulated high-frequency signal, and the amplitude-and-frequency-modulated high-frequency signal from the ultrasonic generator 40. High-frequency signal component of the modulated high-frequency signal acts to cause the region where perpendiculars extend from the vibrating plate 31 of the ultrasonic transducer 2 to the liquid surface to be irradiated with the ultrasonic wave, while low-frequency component of the modulated high-frequency signal (a frequency of the amplitude modulation signal and a frequency of the frequency modulation signal) act so as to excite a plate wave in the vibrating plate 31.

Re-adherence of the particulate contamination to a front surface and a back surface of the object to be cleaned 16 is prevented by driving the ultrasonic transducer 2 with the modulated high-frequency signal. In other words, the ultrasonic transducer 2 is arranged at an end of the vibrating plate 31 having the substantially same surface area as the substrate to be cleaned and, for example, a high-frequency signal of 740 kHz is modulated in amplitude by a frequency sufficiently lower than that of the high-frequency signal of 740 kHz, for example, by an amplitude modulation signal of 2 kHz, so that a plate wave 22 is excited by the vibrating plate 31 at the same frequency as the frequency of the amplitude modulation signal, and is propagated as a travelling wave (having a waveform illustrated on the oscillation plate in FIG. 8) illustrated in FIG. 8. At this time, the cleaning solution 10 in contact with the front surface of the vibrating plate 31 generates a flowing force. In addition, by matching the direction of propagation of the travelling wave (an arrow f illustrated in FIG. 8) by the plate wave 22 and the direction of supply of the cleaning solution 10, the particulate contamination is flowed by a new cleaning solution 10, whereby re-adherence of the particulate contamination onto not only the front surface, but also a back surface of the object to be cleaned 16 is prevented.

Like the ultrasonic cleaning apparatus 30 illustrated in FIG. 8, the cleaning solution 10 in contact with the semiconductor wafer may be provided with the flowing force entirely by providing the vibrating plate 31 so as to cover the entire surface of the back surface of the semiconductor wafer as the object to be cleaned. Accordingly, re-adhesion of the particulate contamination separated from the semiconductor wafer as the object to be cleaned may be prevented and hence efficiency improvement of the cleaning level is achieved.

In the ultrasonic cleaning apparatus 30 illustrated in FIG. 8 as well, since the object to be cleaned 16 is held so as to be positioned out of the ultrasonic-irradiated region in the cleaning tank 4 of the ultrasonic transducer 2 in the same manner as the ultrasonic cleaning apparatus 1 illustrated in FIG. 1, the object to be cleaned 16 is not irradiated directly with the ultrasonic wave, and hence occurrence of damage on the substrate to be cleaned is suppressed.

Figure 9A:
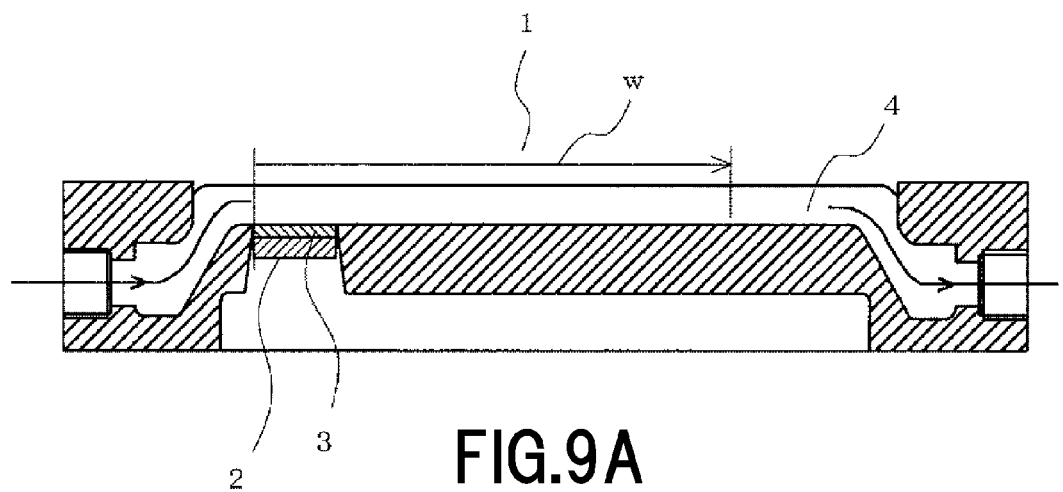
FIG. 9A is a drawing illustrating the measurement point of an ultrasonic acoustic pressure in the ultrasonic cleaning apparatus.
Figure 9B:
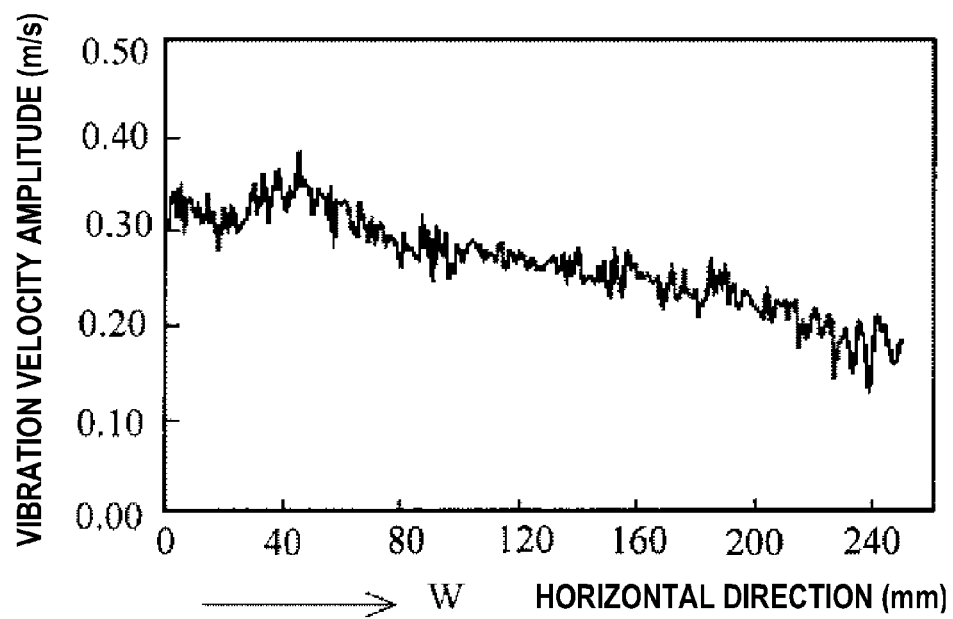
FIG. 9B is a drawing illustrating the result of measurement of a vibration velocity amplitude of the ultrasonic acoustic pressure in the horizontal direction in the cleaning tank.

Subsequently, measurement of the ultrasonic acoustic pressure of the capillary wave in the ultrasonic cleaning apparatus will be described. The measurement of the ultrasonic acoustic pressure of the capillary wave was performed by using a laser Doppler vibrometer (LDV) in the horizontal direction and the vertical direction in the cleaning tank. FIG. 9A is a drawing illustrating a measurement point of the ultrasonic acoustic pressure in the ultrasonic cleaning apparatus, and FIG. 9B is a drawing illustrating a result of the measurement of a vibration velocity amplitude of the ultrasonic acoustic pressure in the horizontal direction in the cleaning tank. As illustrated in FIG. 9A, the measurement in the horizontal direction in the cleaning tank 4 of the ultrasonic cleaning apparatus 30 was performed for a range from the position of the end of the transducer, which was assumed to be 0 mm, up to 240 mm by changing a horizontal migration distance w illustrated in FIG. 9A in the horizontal direction in the vicinity of the surface of the cleaning solution 10. From the result of the measurement illustrated in FIG. 9B, the value of the vibration velocity amplitude was 0.15 m/s or larger within the range to a horizontal distance of 240 mm in the vicinity of the surface of the cleaning solution 10, whereby it was apparent that the ultrasonic acoustic pressure caused by the capillary wave existed, and hence sufficient propagation to a range of the object to be cleaned 16 on the order of 200 mm in size was ensured.

Figure 10A:
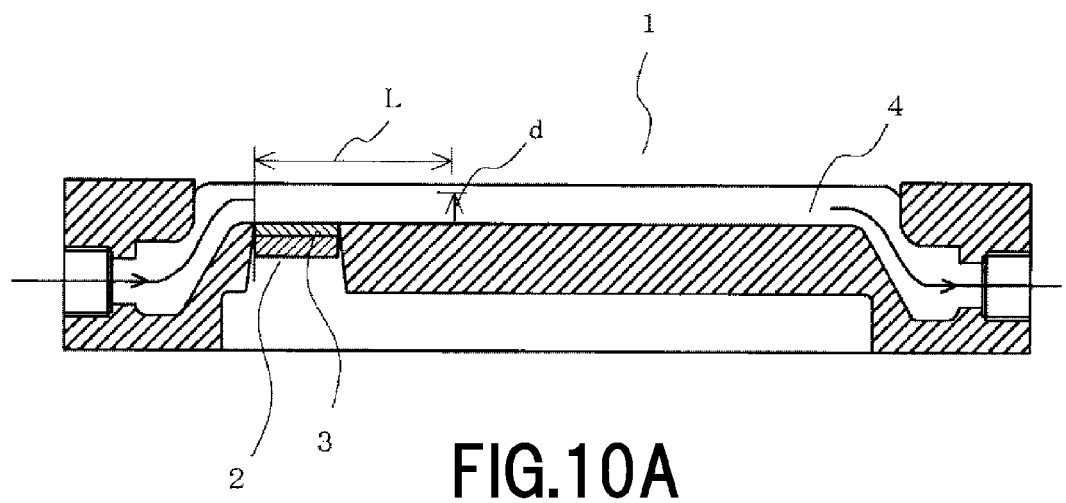
FIG. 10A is a drawing illustrating a measurement point of an ultrasonic acoustic pressure in the ultrasonic cleaning apparatus.
Figure 10B:
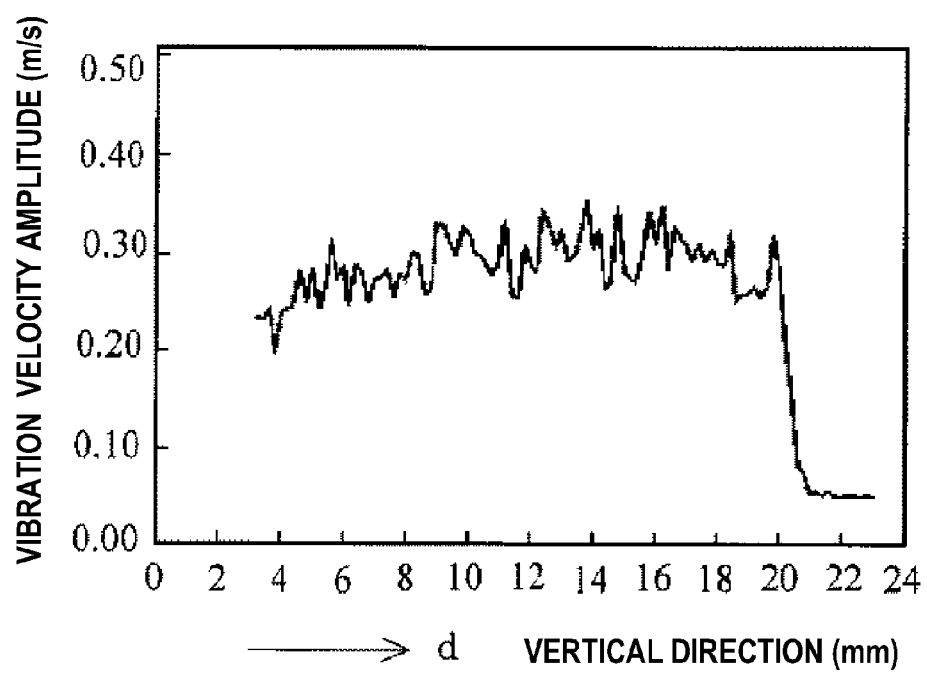
FIG. 10B is a drawing illustrating a result of measurement of a vibration velocity amplitude of the ultrasonic acoustic pressure in the perpendicular direction in a cleaning tank.

Subsequently, measurement of the ultrasonic acoustic pressure in the vertical direction in the cleaning tank will be described with reference to FIGS. 10A and 10B. FIG. 10A is a drawing illustrating a measurement point of the ultrasonic acoustic pressure in the ultrasonic cleaning apparatus, and FIG. 10B is a drawing illustrating a result of the measurement of the vibration velocity amplitude of the ultrasonic acoustic pressure in the vertical direction in the cleaning tank. As illustrated in FIG. 10A, the measurement of the ultrasonic acoustic pressure in the vertical direction in the cleaning tank 4 of the ultrasonic cleaning apparatus 30 was performed for the range of 20 mm from the surface of the vibrating plate, which was assumed to be 0 mm, up to the liquid surface by changing a vertical migration distance d in the vertical direction at the position of a horizontal distance L of 70 mm in the horizontal direction illustrated in FIG. 10A. FIG. 10B is a drawing illustrating the result of the measurement of the vibration velocity amplitude of the ultrasonic acoustic pressure in the vertical direction. As illustrated in FIG. 10B, the vibration velocity amplitude of the ultrasonic acoustic pressure from the front surface of the vibrating plate 31 toward the liquid surface increases, and then stays substantially constant to the range from the liquid surface to the position on the order of 10 mm. Accordingly, the ultrasonic acoustic pressure caused by the capillary wave exists in the range from the liquid surface to at least on the order of 20 mm, and a high cleaning effect was obtained by arranging the object to be cleaned in this range.

Figure 11:
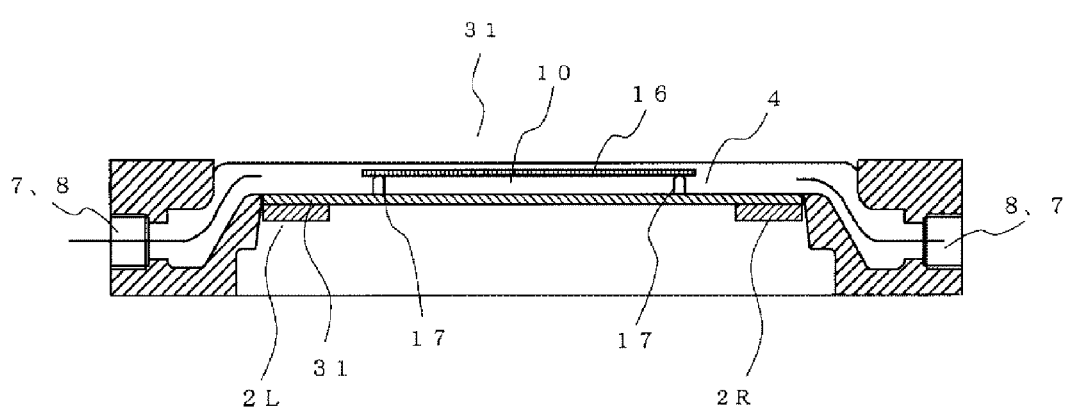
FIG. 11 is a drawing illustrating a configuration of an ultrasonic cleaning apparatus in which ultrasonic transducers are arranged on both left and right ends of the vibrating plate.
Figure 12:
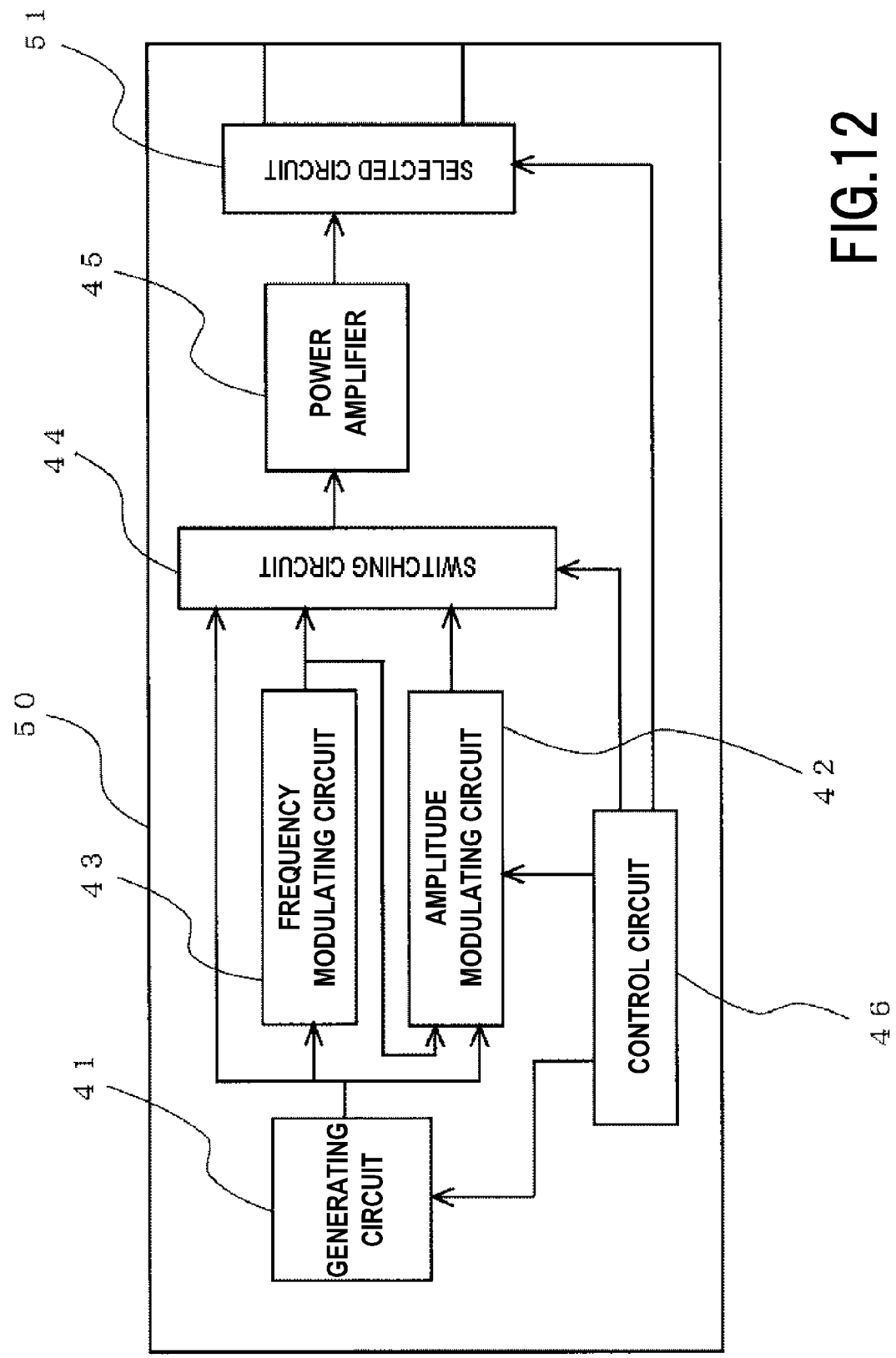
FIG. 12 is a block diagram illustrating a configuration of an ultrasonic generator that drives the ultrasonic transducer of the ultrasonic cleaning apparatus illustrated in FIG. 11.

The ultrasonic cleaning apparatus of the invention is capable of accommodating increase in size of the substrate such as the semiconductor wafer by providing the ultrasonic transducers at both left and right ends of the vibrating plate. Referring now to FIGS. 11 to 13, the ultrasonic cleaning apparatus capable of cleaning a large-sized semiconductor wafer or the like will be described.

As illustrated in FIG. 9B, from the result of measurement of the vibration velocity amplitude, an oscillation velocity sufficient for removing particles was obtained from an end surface of the ultrasonic transducer to a point on the order of 200 mm where the object to be cleaned such as the substrate existed. However, the vibration velocity amplitude was gradually reduced as the distance in the horizontal direction was increased. Therefore, there is a probability that a sufficient vibration velocity amplitude for removing particles cannot be obtained for larger substrate, for example, semiconductor wafers such as a wafer substrates having a diameter of 450 mm. Therefore, the ultrasonic transducers are provided at both left and right ends of the vibrating plate to allow sufficient cleaning for the substrates having larger sizes.

FIG. 11 is a drawing illustrating a configuration of the ultrasonic cleaning apparatus in which the ultrasonic transducers are arranged on both the left and right ends of the vibrating plate. The same components as those in FIG. 8 are denoted by the same reference numerals, and detailed description relating to the configuration thereof is omitted. As illustrated in FIG. 11, ultrasonic transducers 2L and 2R are provided at both left and right ends of the vibrating plate 31 of an ultrasonic cleaning apparatus 32. The cleaning tank 4 has a size sufficient for cleaning large-diameter substrates such as the semiconductor wafers having a diameter of 450 mm. The cleaning solution supply port 7 is provided on one side surface of the cleaning tank 4, and the cleaning liquid draining port 8 is provided on the other side surface of the cleaning tank 4. When the ultrasonic transducer 2L positioned on the left end of the vibrating plate 31 is driven, a port on a left side surface of the cleaning tank 4 serves as the cleaning solution supply port 7 and a port on a right side surface of the cleaning tank 4 serves as the cleaning liquid draining port 8. When the ultrasonic transducer 2R positioned on the right end of the vibrating plate 31 is driven, the port on the right side surface of the cleaning tank 4 serves as the cleaning solution supply port 7 and the port on the left side surface of the cleaning tank 4 serves as the cleaning liquid draining port 8.

FIG. 12 is a block diagram illustrating a configuration of the ultrasonic generator that drives the ultrasonic transducer of the ultrasonic cleaning apparatus illustrated in FIG. 11. The same components as the ultrasonic generator in FIG. 3 are denoted by the same reference numerals, and detailed description relating to the configuration thereof is omitted. As illustrated in FIG. 12, an ultrasonic generator 50 is provided with a selected circuit 51 which receives an output from the power amplifier 45 as an input, and has two outputs. The ultrasonic transducer 2L at the left end of the vibrating plate 31 is connected to one of the two outputs from the selected circuit, and the ultrasonic transducer 2R at the right end of the vibrating plate 31 is connected to the other output of the selected circuit. The control circuit 46 controls the selected circuit 51 and supplies the high-frequency power from the power amplifier 45 to the ultrasonic transducer through one of the two outputs of the selected circuit 51.

Figure 13A:
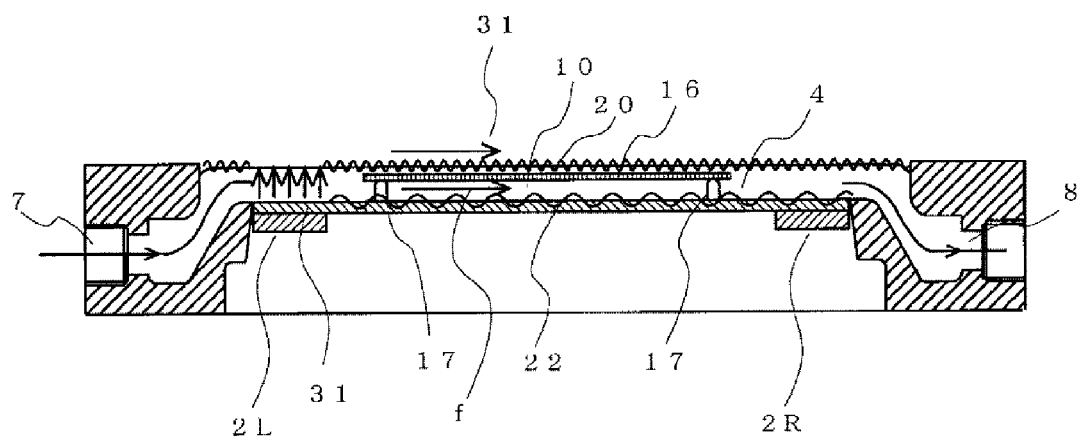
FIG. 13A is a drawing illustrating propagation of an ultrasonic wave when the ultrasonic transducer positioned on the left side of the vibrating plate is driven.

FIG. 13A is a drawing illustrating propagation of the ultrasonic wave when the ultrasonic transducer positioned on the left side of the vibrating plate is driven. By driving the ultrasonic transducer 2L positioned on the left side of the vibrating plate 31 by the ultrasonic generator 50, the capillary wave 20 and the plate wave 22 generated by the ultrasonic cleaning apparatus 32 are propagated from the left toward the right illustrated by an arrow as illustrated in FIG. 13A. At this time, re-adherence of particles may be prevented by aligning the direction of the flow of the cleaning solution 10 with the direction of propagation of the capillary wave 20 and the plate wave 22 with the port on the left side surface of the cleaning tank 4 serving as the cleaning solution supply port 7 and the port on the right side surface of the cleaning tank 4 serving as the cleaning liquid draining port 8.

Figure 13B:
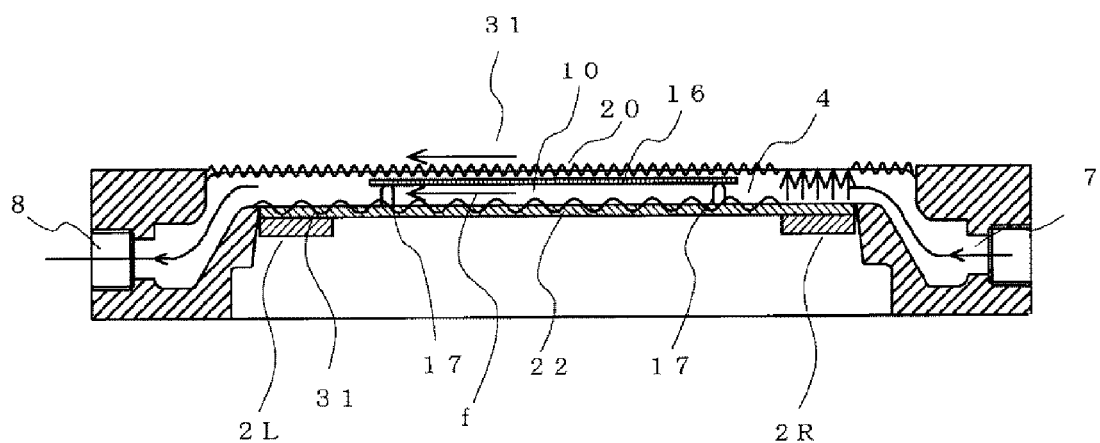
FIG. 13B is a drawing illustrating the propagation of the ultrasonic wave when the ultrasonic transducer positioned on the right side of the vibrating plate is driven.

FIG. 13B is a drawing illustrating propagation of the ultrasonic wave when the ultrasonic transducer positioned on the right side of the vibrating plate is driven. By driving the ultrasonic transducer 2R positioned on the right side of the vibrating plate 31 by the ultrasonic generator 50, the capillary wave 20 and the plate wave 22 generated by the ultrasonic cleaning apparatus 32 are propagated from the right to the left illustrated by an arrow as illustrated in FIG. 13B. At this time, re-adherence of the particles may be prevented by aligning the flow of the cleaning solution 10 with the direction of propagation of the capillary wave 20 and the plate wave 22 with the port on the right side surface of the cleaning tank 4 serving as the cleaning solution supply port 7 and the port on the left side surface of the cleaning tank 4 serving as the cleaning liquid draining port 8.

In this manner, reduction of the vibration velocity amplitude may be compensated with respect to each other by switching the drive of the left and right ultrasonic transducers alternately by the ultrasonic generator. Re-adherence of particles may also be prevented by switching the flow of the cleaning solution in the same manner alternately between the leftward direction and the rightward direction. Accordingly, sufficient removal and cleaning of the particles may be performed also for large substrates.

The ultrasonic cleaning apparatus illustrated in FIG. 11 has a configuration in which the ultrasonic transducers are arranged on both the left and right ends of the vibrating plate, However, not only the configuration in which the ultrasonic transducers are disposed on the both left and right ends of the vibrating plate, but also, for example, a configuration in which a ring-shaped ultrasonic transducer is disposed, a configuration in which the ultrasonic transducers are disposed on front, rear, left, and right ends of the vibrating plate, and a configuration in which an U-shaped ultrasonic transducer is disposed are also applicable. In this manner, one or more of the ultrasonic transducers may be arranged so as to surround the object to be cleaned in plan view. In these configurations of the ultrasonic transducers, the object to be cleaned is held so as to be positioned out of the region where perpendiculars extend from the oscillating surface of ultrasonic transducer to the liquid surface.

Subsequently, a result of cleaning performed by the ultrasonic cleaning apparatus illustrated in FIG. 8 for conforming effectiveness of the ultrasonic cleaning by the capillary wave generated by the ultrasonic wave will be described. In the ultrasonic cleaning, a semiconductor wafer formed of silicon having a diameter of 200 mm as the object to be cleaned 16 was used, and pure water was used as the cleaning solution 10. The ultrasonic transducer 2 was a ceramic flat plate having a width of 40 mm and a length of 160 mm, and output an ultrasonic wave of 150 W at a frequency of 740 kHz. In the ultrasonic generator, the frequency-modulated and amplitude-modulated high-frequency signal was selected, and a frequency modulation width was ±5 kHz, the amplitude-modulated frequency was 2 kHz, and the frequency of the high-frequency signal was 740 kHz±5 kHz. The flow rate of the pure water was 3 Liter/min.

Figure 14A:
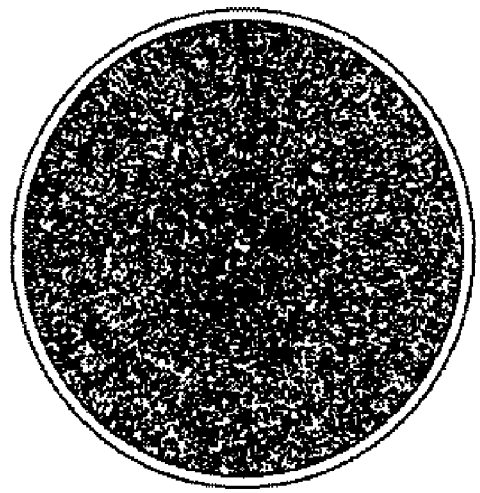
FIG. 14A is a drawing illustrating a particle distribution of a semiconductor wafer before cleaning.

First of all, particulate silicon nitride (Si3N4) as contaminant was applied to the surface of the semiconductor wafer before cleaning. The size of the particles was 0.12 µm or larger in diameter, and the number of the particles was on the order of 25,000. The particles on the semiconductor wafer after the application of the contaminant were indicated by spots as illustrated in FIG. 14A. The semiconductor wafer in this state was set on the holding portion 17 of the ultrasonic cleaning apparatus 30, the ultrasonic transducer 2 was excited by the ultrasonic generator 40, and the ultrasonic cleaning was performed for 30 seconds. After the ultrasonic cleaning, the number of the particles remaining on the semiconductor wafer was counted.

Figure 14B:
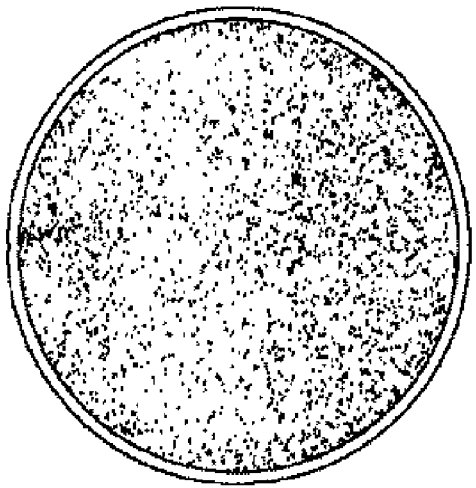
FIG. 14B is a drawing illustrating the particle distribution of the semiconductor wafer after cleaning.

FIG. 14A is a drawing illustrating a particle distribution of the semiconductor wafer before cleaning, and FIG. 14B is the drawing illustrating the particle distribution of the semiconductor wafer after the ultrasonic cleaning for 30 seconds. The particles are indicated by the spots. It was found from the result of counting of the number of the particles after the ultrasonic cleaning that 92% of the particles were removed.

From the result described above, 90% or more of the particles applied on the semiconductor wafer before the cleaning was removed, so that the effectiveness of the ultrasonic cleaning apparatus and the ultrasonic cleaning method using the capillary wave according to the invention was confirmed.

Second Embodiment

Figure 15:
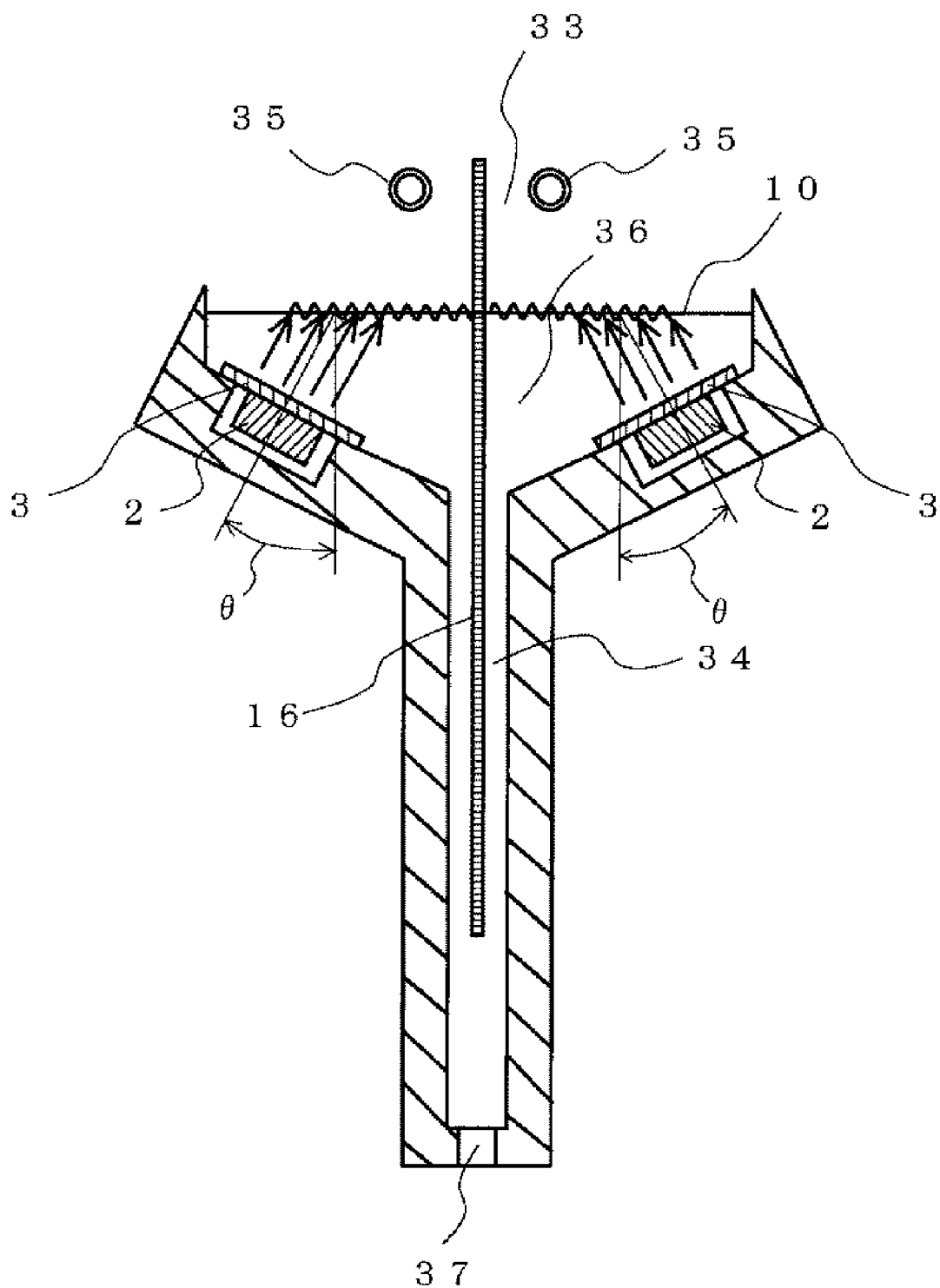
FIG. 15 is a cross-sectional view illustrating a configuration of an ultrasonic cleaning apparatus according to a second embodiment of the invention.

Subsequently, an ultrasonic cleaning apparatus according to a second embodiment in which cleaning is performed while moving the object to be cleaned will be described. FIG. 15 is a cross-sectional view illustrating a configuration of the ultrasonic cleaning apparatus according to the second embodiment of the invention. The ultrasonic cleaning apparatus 1 illustrated in FIG. 1 and FIG. 3 performs cleaning of the object to be cleaned 16 in the state of being immersed in the cleaning tank 4 and fixed. In contrast, an ultrasonic cleaning apparatus 33 illustrated in FIG. 15 is configured to perform cleaning while moving the object to be cleaned 16. The same components as those in FIG. 1 are denoted by the same reference numerals, and detailed descriptions relating to the configuration thereof are omitted.

As illustrated in FIG. 15, the ultrasonic cleaning apparatus 33 includes a cleaning tank 36 configured to store the cleaning solution 10, a storage portion 34 configured to store the object to be cleaned 16 provided on a lower portion of the cleaning tank 4, a cleaning solution supply port 37 provided on a bottom of the storage portion 34, and a nozzle 35 ejecting high-temperature nitrogen gas. As illustrated in FIG. 15, a bottom of the cleaning tank 36 is formed into a substantially V-shape, and a center of the bottom is formed integrally with the storage portion 34. The bottoms positioned on the left and the right of the cleaning tank 36 extend obliquely toward the center of the bottom, and an oblique both surfaces are each provided with the vibrating plate 3. The ultrasonic transducer 2 is attached to the back surface of each of the vibrating plates 3 by adhesion. Accordingly, the ultrasonic wave irradiated from the ultrasonic transducers 2 and the vibrating plates have an incident angle with respect to the liquid surface. The ultrasonic waves are radiated from the vibrating plates 3 toward the liquid surface by driving the ultrasonic transducers 2 and the capillary wave was generated on the liquid surface. By setting the incident angle θ of the ultrasonic wave illustrated in FIG. 15 to the angle which prevents the flat ultrasonic wave from the ultrasonic transducers from directly hitting against the object to be cleaned, the capillary wave may be propagated in one direction, that is, in the direction where the object to be cleaned 16 is positioned, so that the effective utilization of the capillary wave is achieved.

In the ultrasonic cleaning apparatus illustrated in FIG. 15, the liquid surface is irradiated with all of the flat ultrasonic waves from the ultrasonic transducers, and the object to be cleaned is held so as to be positioned out of the region where perpendiculars extend from the surface of the ultrasonic transducer to the liquid surface. Therefore, only the capillary wave on the liquid surface is applied to the surface of the object to be cleaned.

Figure 16:
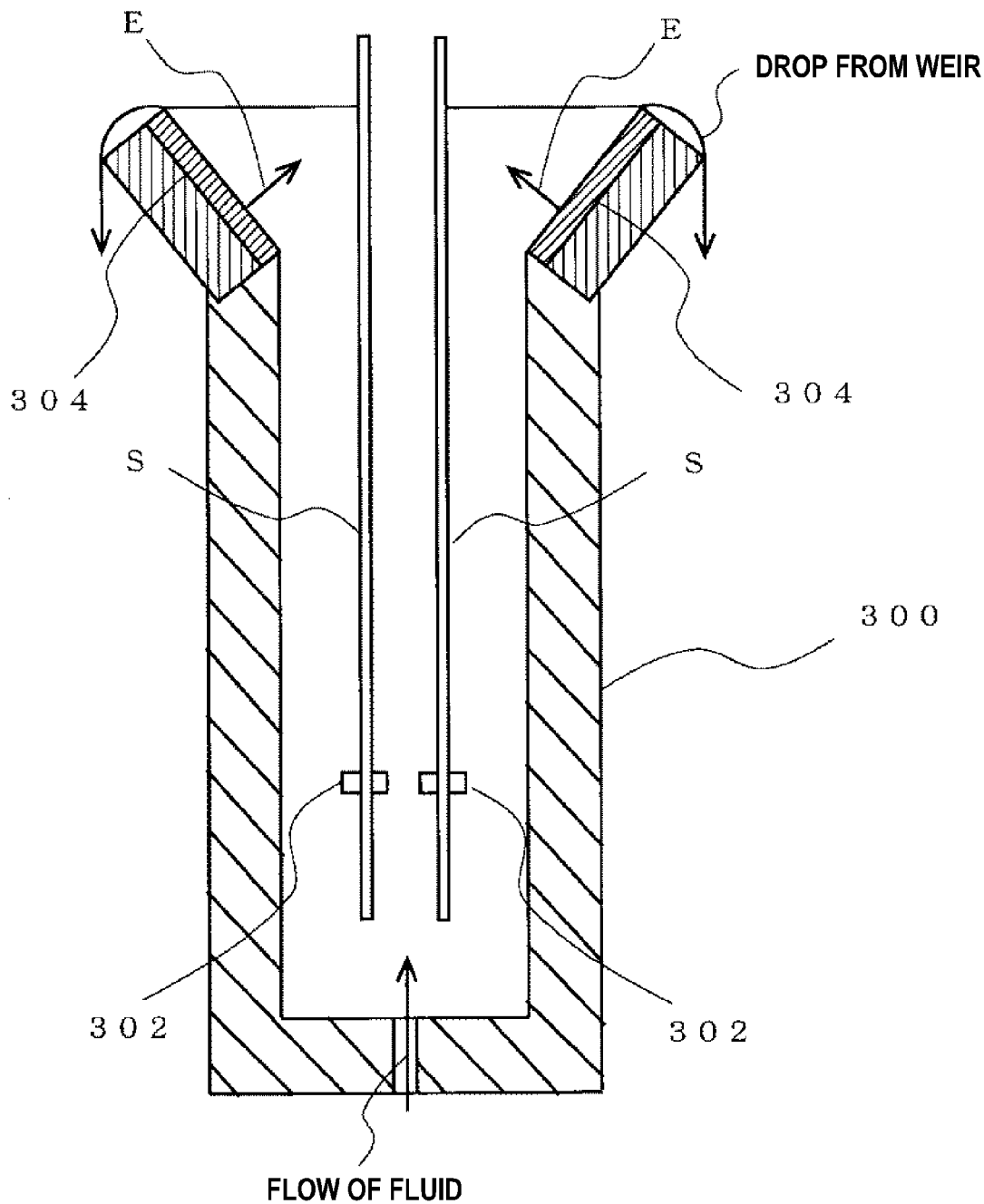
FIG. 16 is a cross-sectional view illustrating a configuration of a processing apparatus disclosed in JP-T-2005-512340.

In the configuration of the processing apparatus illustrated in FIG. 16 as well, megasonic vibrating units 304 are disposed at both ends of an upper portion of a chamber 300 obliquely with respect to the liquid surface. However, in the processing apparatus illustrated in FIG. 16, energy irradiated from the megasonic vibrating unit 304 (the ultrasonic energy) comes into direct contact with the object to be cleaned in the liquid, and the object to be cleaned is cleaned by the flat ultrasonic wave. Therefore, the ultrasonic cleaning apparatus of the invention and the processing apparatus illustrated in FIG. 16 are different in configuration and operation.

In the ultrasonic cleaning apparatus 33 illustrated in FIG. 15, the semiconductor wafer as the object to be cleaned 16 is immersed in the storage portion 34 and the cleaning tank 36 standstill by a conveying apparatus, not illustrated, and is pulled gradually upward by the conveying apparatus while applying the ultrasonic wave thereto. Also, at the same time as the pulling-up operation, high-temperature nitrogen gas is supplied to the surface of the semiconductor wafer by the nozzles 35, whereby liquid is drained off and dried. Accordingly, the cleaning solution 10 supplied from the cleaning solution supply port 7 of the storage portion 34 overflows from an upper edge of the cleaning tank 36 and flows to the outside.

In this manner, the ultrasonic cleaning apparatus 33 illustrated in FIG. 15 stores the object to be cleaned vertically by the storage portion 34 provided on a lower portion of the cleaning tank 36, so that a space required for installation may be small. Since the object to be cleaned 16 is cleaned while being moved, the cleaning level is not affected by the size of the object to be cleaned 16, so that even the large semiconductor wafer may be cleaned.

As described above, according to the invention, the object to be cleaned is held so as to be positioned out of the ultrasonic-irradiated region in the cleaning tank of the ultrasonic transducer, and the cleaning is performed without irradiating the object to be cleaned directly with the ultrasonic wave, so that damage on the substrate to be cleaned may be suppressed.

The ultrasonic wave is applied to the surface of the cleaning solution in the proximity to the surface of the object to be cleaned to excite the capillary wave, and the particulate contamination is separated from the object to be cleaned by the acoustic pressure caused by the capillary wave, so that the cleaning at a high cleaning level may be performed with respect to the highly precise substrate and the like.

The cleaning solution is supplied in the direction same as the direction of propagation of the capillary wave, so that re-adhesion of the particles separated from the object to be cleaned may be prevented.

The object to be cleaned is held so as to extend in parallel to the liquid surface of the cleaning solution in the cleaning tank and position in the vicinity of the liquid level of the cleaning solution, and the distance from the object to be cleaned to the liquid surface of the cleaning solution is set to be 10 mm (millimeter) or smaller, so that the depth of the cleaning tank may be small, and hence the cleaning with small amount of the cleaning solution is enabled.

Since the capillary wave propagates over the entire area of the object to be cleaned along the surface of the object to be cleaned according to the invention, since the moving device configured to move the object to be cleaned during the cleaning is not necessary, the ultrasonic cleaning apparatus may be simplified.

The invention may be embodied in various modes without departing the essential characteristics. Therefore, needless to say, the embodiment described above is given only for description and does not limit the invention.

What is claimed is:

1. An ultrasonic cleaning apparatus comprising:
   a cleaning tank in which a cleaning solution is stored and an object to be cleaned is immersed therein;
   a plurality of holding portions which hold the object to be cleaned such that a front surface of the object to be clean is parallel to a liquid surface of the cleaning solution;
   an ultrasonic transducer configured to generate an ultrasonic oscillation;
   a vibrating plate configured to apply the ultrasonic oscillation from the ultrasonic transducer to the cleaning solution; and
   an ultrasonic generator configured to drive the ultrasonic transducer, wherein:
   the plurality of holding portions hold the object in a holding region, the holding region being out of a region formed where perpendiculars extend from an oscillating surface of the ultrasonic transducer to the liquid surface,
   the ultrasonic transducer is driven to transmit, via the vibrating plate, an ultrasonic wave toward the liquid surface of the cleaning solution in a direction perpendicular to the liquid surface, so as to generate a capillary wave on the liquid surface,
   the object is cleaned by the capillary wave, and
   the vibrating plate is positioned above an inlet and an outlet for the cleaning solution.

2. The ultrasonic cleaning apparatus according to claim 1, wherein the cleaning solution is supplied so that the cleaning solution flows in a same direction as a direction of propagation of the capillary wave.

3. The ultrasonic cleaning apparatus according to claim 1, wherein a distance from the object to be cleaned to the liquid surface of the cleaning solution is 10 mm (millimeters) or smaller.

4. The ultrasonic cleaning apparatus according to claim 1, wherein the object to be cleaned is positioned in a vicinity of the liquid surface of the cleaning solution.

5. The ultrasonic cleaning apparatus according to claim 1, wherein the ultrasonic transducer and the vibrating plate are provided so as to be parallel to the liquid surface of the cleaning solution.

6. The ultrasonic cleaning apparatus according to claim 1, wherein the ultrasonic transducer and the vibrating plate are provided obliquely with respect to the liquid surface of the cleaning solution.

7. The ultrasonic cleaning apparatus according to claim 1, wherein:
   the vibrating plate is arranged over an entire bottom surface of the cleaning tank, and
   the ultrasonic generator configured to drive the ultrasonic transducer includes a generating circuit, an amplitude modulating circuit, and a frequency modulating circuit, and is configured to perform cleaning by exciting the ultrasonic transducer with a signal obtained by modulating a signal having a frequency of 400 KHz or higher from the generating circuit by at least one of the amplitude modulating circuit and the frequency modulating circuit, and irradiating an interior of the cleaning solution with an ultrasonic wave.

8. The ultrasonic cleaning apparatus according to claim 1, wherein the ultrasonic transducer comprises a plurality of ultrasonic transducer elements arranged so as to surround the object to be cleaned in plan view.

9. The ultrasonic cleaning apparatus according to claim 1, wherein the vibrating plate is provided at a bottom portion of the cleaning tank.

* * * * *